United States Patent
Simsek-Ege et al.

(10) Patent No.: US 12,426,239 B2
(45) Date of Patent: Sep. 23, 2025

(54) MICROELECTRONIC DEVICES, RELATED ELECTRONIC SYSTEMS, AND METHODS OF FORMING MICROELECTRONIC DEVICES

(71) Applicant: Micron Technology, Inc., Boise, ID (US)

(72) Inventors: Fatma Arzum Simsek-Ege, Boise, ID (US); Richard E. Fackenthal, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 554 days.

(21) Appl. No.: 17/804,234

(22) Filed: May 26, 2022

(65) Prior Publication Data

US 2023/0389275 A1     Nov. 30, 2023

(51) Int. Cl.
*H10B 12/00* (2023.01)
*H01L 23/528* (2006.01)

(52) U.S. Cl.
CPC ......... *H10B 12/30* (2023.02); *H01L 23/5283* (2013.01); *H10B 12/03* (2023.02); *H10B 12/05* (2023.02)

(58) Field of Classification Search
CPC ...... H10B 12/30; H10B 12/50; H01L 23/5283
See application file for complete search history.

(56) References Cited

U.S. PATENT DOCUMENTS

| | | | |
|---|---|---|---|
| 5,901,099 A | 5/1999 | Gilliam et al. | |
| 6,778,452 B2 | 8/2004 | Beigel et al. | |
| 8,067,286 B2 | 11/2011 | Parekh et al. | |
| 8,153,499 B2 | 4/2012 | Or-Bach et al. | |
| 8,184,471 B2 | 5/2012 | Woo et al. | |
| 8,546,188 B2 | 10/2013 | Liu et al. | |
| 8,716,116 B2 | 5/2014 | Parekh et al. | |
| 9,543,433 B2 | 1/2017 | Anathan et al. | |
| 10,163,480 B1 * | 12/2018 | Kawamura | G11C 7/08 |
| 10,366,740 B1 | 7/2019 | Kim et al. | |
| 11,848,309 B2 | 12/2023 | Simsek-Ege | |
| 2011/0169072 A1 | 7/2011 | Lim et al. | |
| 2014/0347945 A1 | 11/2014 | Venkata et al. | |
| 2018/0323199 A1 | 11/2018 | Roberts et al. | |
| 2019/0074277 A1 * | 3/2019 | Ramaswamy | G11C 11/223 |
| 2019/0244656 A1 | 8/2019 | Li et al. | |

(Continued)

*Primary Examiner* — Shih Tsun A Chou
(74) *Attorney, Agent, or Firm* — TraskBritt

(57) ABSTRACT

A microelectronic device comprises a vertical stack of memory cells. The vertical stack of memory cells comprises a vertical stack of access devices, a vertical stack of capacitors horizontally neighboring the vertical stack of access devices, a conductive pillar structure in electrical communication with the vertical stack of access devices, and an isolated conductive structure in electrical communication with a multiplexer comprising a vertically uppermost access device of the vertical stack of access devices. The microelectronic device further comprises a stack structure comprising conductive structures interleaved with insulative structures, at least some of the conductive structures individually in electrical communication with a memory cell of the vertical stack of memory cells and comprising a gate of an access device of the vertical stack of access devices. Related electronic systems and methods are also described.

30 Claims, 19 Drawing Sheets

(56) References Cited

U.S. PATENT DOCUMENTS

| | | |
|---|---|---|
| 2019/0244933 A1 | 8/2019 | Or-Bach et al. |
| 2020/0052070 A1 | 2/2020 | Derner et al. |
| 2020/0066730 A1 | 2/2020 | Guo et al. |
| 2020/0105330 A1 | 4/2020 | Kimura et al. |
| 2021/0217460 A1 | 7/2021 | Montierth et al. |
| 2022/0399308 A1 | 12/2022 | Simsek-Ege et al. |
| 2023/0018127 A1 | 1/2023 | Gandhi et al. |
| 2023/0207505 A1 | 6/2023 | Simsek-Ege et al. |
| 2023/0262988 A1 | 8/2023 | Harari |

* cited by examiner

MICROELECTRONIC DEVICES, RELATED ELECTRONIC SYSTEMS, AND METHODS OF FORMING MICROELECTRONIC DEVICES

TECHNICAL FIELD

The disclosure, in various embodiments, relates generally to the field of microelectronic device design and fabrication. More specifically, the disclosure relates to methods of forming microelectronic devices from independently formed microelectronic device structures, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random access memory (DRAM) devices; and non-volatile memory devices such as NAND Flash memory devices. A typical memory cell of a DRAM device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g. bit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device.

DETAILED DESCRIPTION

Figure 1A:
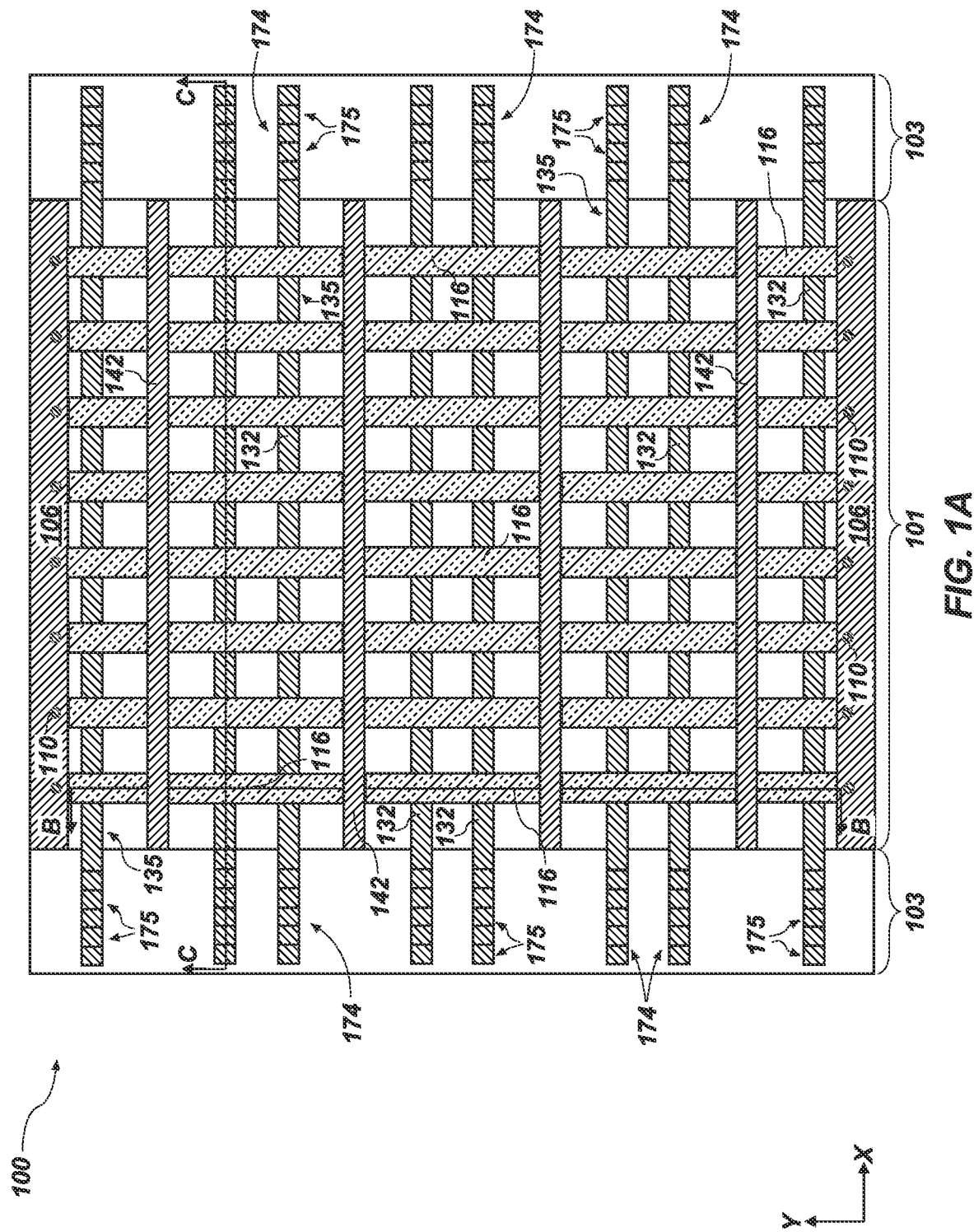
FIG. 1A through FIG. 1K are simplified partial top-down views (FIG. 1A, FIG. 1D, FIG. 1G, FIG. 1I, and FIG. 1K) and simplified partial cross-sectional views (FIG. 1B, FIG. 1C, FIG. 1E, FIG. 1F, FIG. 1H, FIG. 1J, FIG. 1L, and FIG. 1M) illustrating a method of forming a first microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, "semiconductor material" or "semiconductive material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

According to embodiments described herein, a first microelectronic device structure is formed by forming vertical stacks of memory cells. Each vertical stack of memory cells individually comprises a vertical stack of capacitor structures horizontally neighboring a vertical stack of access devices. A conductive pillar structure vertically extends through or along the vertical stack of memory cells and is in electrical communication with the vertical stack of access devices. Vertically uppermost access devices comprise multiplexers configured to place the conductive pillar structure in electrical communication with a global digit line to subsequently be formed vertically overlying the multiplexers. A conductive plate structure vertically extends proximate the vertical stack of memory cells and is in electrical communication with electrodes of the vertical stack of capacitor structures. A mask material is formed over the microelectronic device structure and an upper portion of the conductive plate structure is removed through the mask material. Dielectric materials of the capacitor structures of the vertically uppermost two levels of capacitor structures are selectively removed relative to electrodes of the capacitor structures. A conductive material is formed vertically over remaining portions of the conductive plate structure and between electrodes of the uppermost two levels of the capacitor structures. A portion of the conductive material is removed to form isolated conductive structures from the uppermost levels of capacitor structures and an additional conductive structure from the second uppermost level of capacitor structures. Each of the isolated conductive structures is individually in electrical communication with a multiplexer. The additional conductive structure is in electrical communication with the conductive plate structure. A global digit line is formed vertically over the vertical stacks of memory cells and in electrical communication with at least some of the isolated conductive structures.

The isolated conductive structures are individually in electrical communication with multiplexers configured to selectively place the global digit line in electrical communication with the conductive pillar structure. The first microelectronic device structure is attached to a second microelectronic device structure including control logic circuitry to form a microelectronic device. The additional conductive structure is configured to be in electrical communication with the conductive pillar structure by means of the access devices horizontally neighboring the additional conductive structure (e.g., the second vertically uppermost access devices) and configured to place the conductive pillar structure in electrical communication with the conductive plate structure.

Forming the first microelectronic device structure to include the multiplexers and the transistors in electrical communication with the conductive plate structure in the vertically uppermost levels of the vertical stack of access devices facilitates forming a greater density of memory cells within a given horizontal area (e.g., within a given footprint) compared to microelectronic devices in which multiplexers are formed outside of the vertical stack of memory cells (e.g., above or below the vertical stack of memory cells). In addition, placing the multiplexers in the vertically uppermost level of access devices facilitates use of so-called dummy levels of memory cells to form the multiplexers and the transistors in electrical communication with the conductive plate structure.

FIG. 1A through FIG. 1M are simplified partial top-down views (FIG. 1A, FIG. 1D, FIG. 1G, FIG. 1I, and FIG. 1K) and simplified partial cross-sectional views (FIG. 1, FIG. 1C, FIG. 1E, FIG. 1F, FIG. 1H, FIG. 1J, FIG. 1L, and FIG.

1M) illustrating a method of forming a first microelectronic device structure 100 (e.g., a memory device, such as a 3D DRAM memory device), in accordance with embodiments of the disclosure. With the description provided below, it will be readily apparent to one of ordinary skill in the art that the methods and structures described herein with reference to FIG. 1A through FIG. 1M may be used in various devices and electronic systems. The first microelectronic device structure 100 may also be referred to herein as a first die or a first wafer.

Figure 1B:
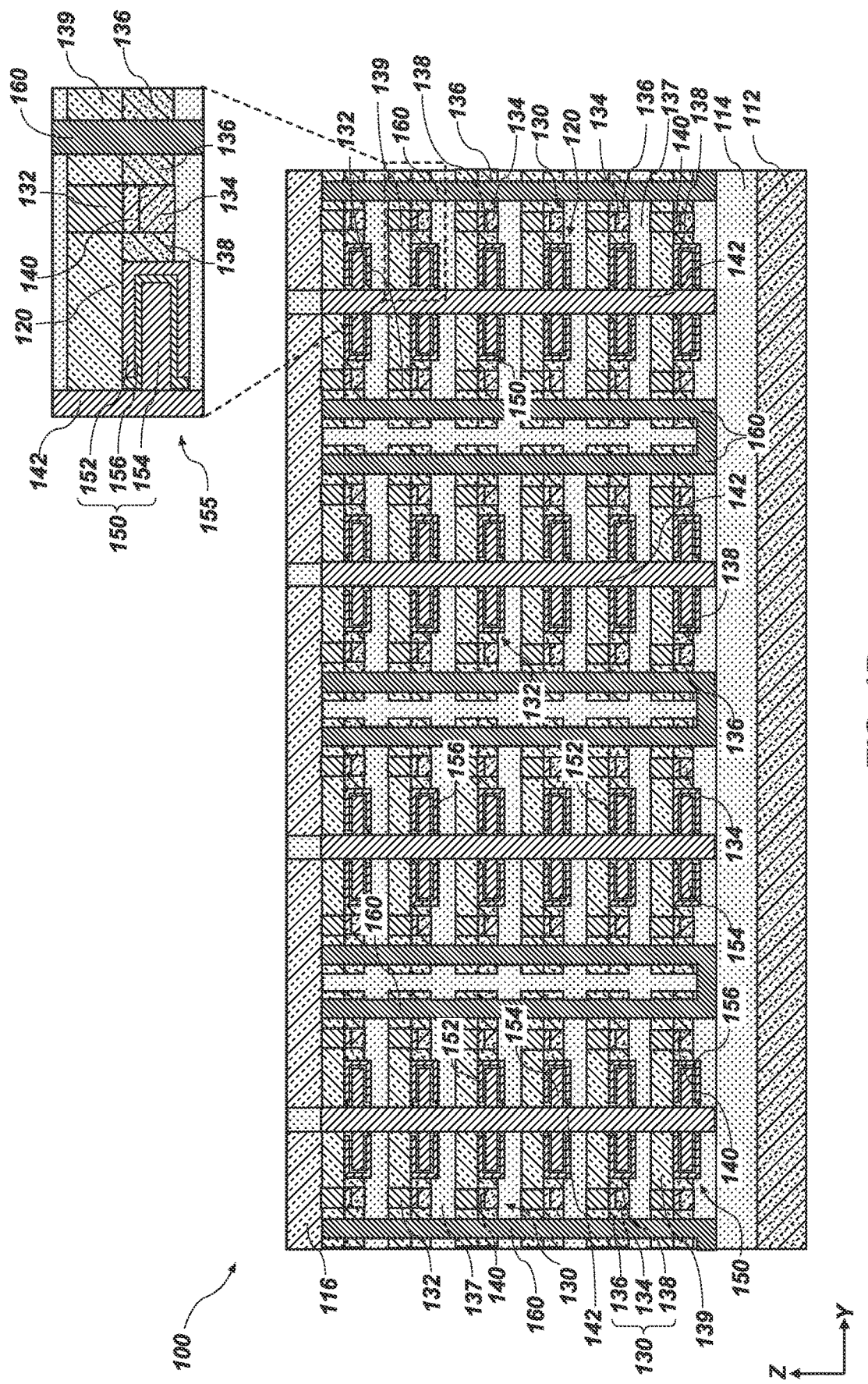
Figure 1C:
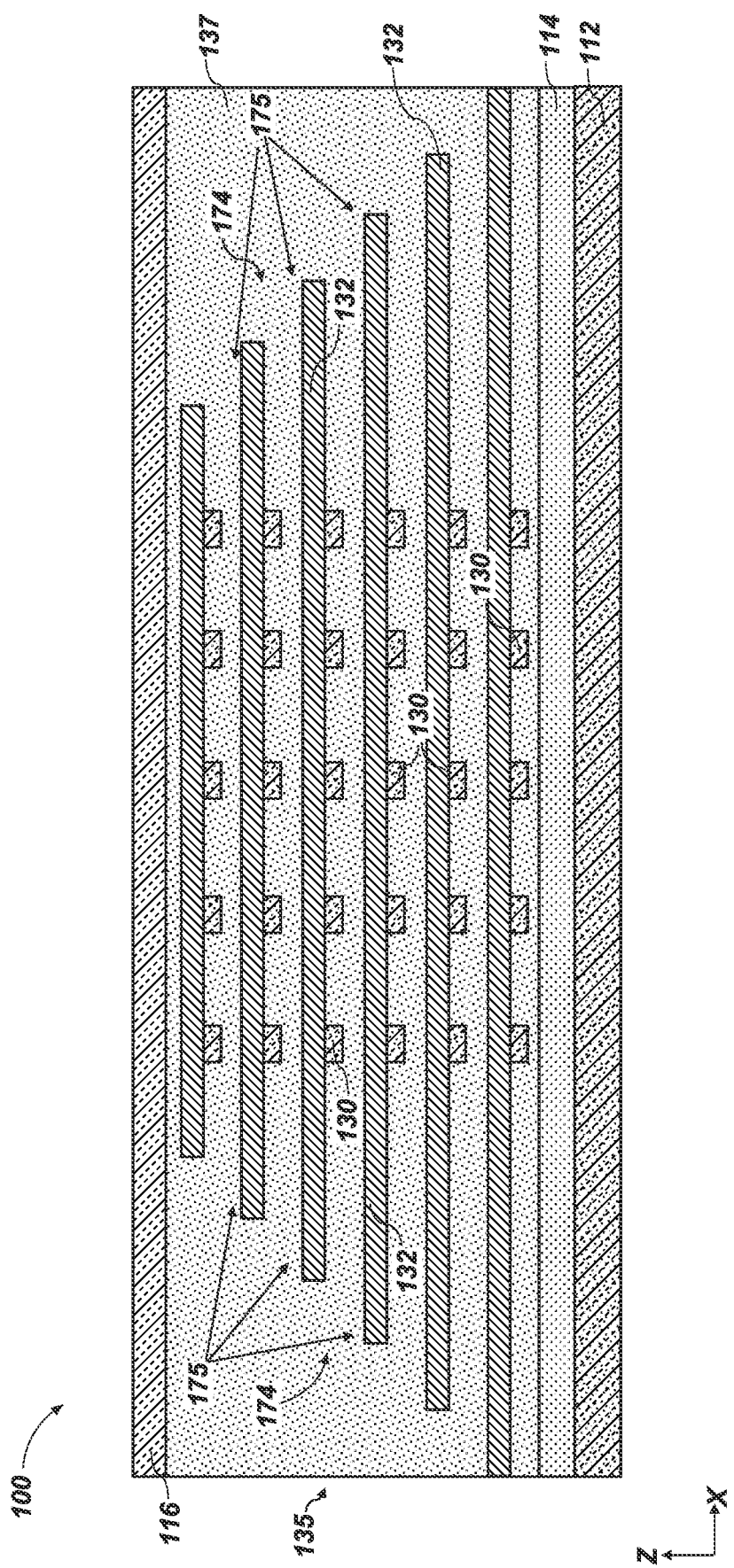

FIG. 1A is a simplified partial top-down view of the first microelectronic device structure 100; FIG. 1B is a simplified partial cross-sectional view of the first microelectronic device structure 100 taken through section line B-B of FIG. 1A; and FIG. 1C is a simplified partial cross-sectional view of the first microelectronic device structure 100 taken through section line C-C of FIG. 1A.

Referring to FIG. 1A, the first microelectronic device structure 100 includes an array region 101 (also referred to herein as a "memory array region") and one or more peripheral regions 103 located external to the array region 101. In some embodiments, the peripheral regions 103 horizontally (e.g., in at least X-direction) surround the array region 101. In some embodiments, the peripheral regions 103 substantially surround all horizontal sides of the array region 101 in a first horizontal direction (e.g., the X-direction). In other embodiments, the peripheral regions 103 substantially surround all horizontal boundaries (e.g., an entire horizontal area) of the array region 101.

With reference to FIG. 1A and FIG. 1B, within the array region 101, the first microelectronic device structure 100 includes vertical (e.g., in the Z-direction) stacks of memory cells 120 over a first base structure 112. A mask material 116 vertically overlies (e.g., in the Z-direction) the vertical stacks of memory cells 120. Since the vertical stacks of memory cells 120 vertically underlie (e.g., in the Z-direction) the mask material 116, the vertical stacks of memory cells 120 are not illustrated in FIG. 1A.

The mask material 116 may be formed of and include one or more of a photoresist material, nitride mask (e.g., silicon nitride, titanium nitride, aluminum nitride), silicon carbide, carbon doped hydrogenated silicon oxide (SiOCH), amorphous carbon, or a spin-on mask material. However, the disclosure is not so limited and the mask material 116 may include materials other than those described above.

With reference to FIG. 1B, each vertical stack of memory cells 120 comprises a vertical stack of access devices 130 and a vertical stack of storage devices 150, the storage devices 150 of the vertical stack of storage devices 150 coupled to the access devices 130 of the vertical stack of access devices 130. The vertical stack of access devices 130 may horizontally neighbor (e.g., in the X-direction) the vertical stack of storage devices 150. The vertical stacks of memory cells 120 may individually include vertically spaced (e.g., in the Z-direction) levels of memory cells 120, each memory cell 120 individually comprising a storage device 150 horizontally neighboring an access device 130.

The first base structure 112 may include a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such monocrystalline silicon or polycrystalline silicon; silicon-germanium; germanium; gallium arsenide; a gallium nitride; and indium phosphide). In some embodiments, the first base structure 112 comprises a silicon wafer.

In some embodiments, the first base structure 112 includes different layers, structures, devices, and/or regions formed therein and/or thereon. In some embodiments, the first base structure 112 includes complementary metal-oxide-semiconductor (CMOS) circuitry and devices configured for effectuating operation of the vertical stacks of memory cells 120 of the first microelectronic device structure 100.

The first base structure 112 may be electrically isolated from the vertical stacks of memory cells 120 by a first insulative material 114 vertically intervening (e.g., in the Z-direction) between the first base structure 112 and the vertical stacks of memory cells 120. The first insulative material 114 may be formed of and include insulative material such as, for example, one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the first insulative material 114 comprises silicon dioxide.

With continued reference to FIG. 1B, each of the access devices 130 may individually be operably coupled to a conductive structure 132 (FIG. 1A through FIG. 1C) of a vertical stack structure 135 (FIG. 1A, FIG. 1C) comprising vertically spaced (e.g., in the Z-direction) levels of the conductive structures 132 (also referred to herein as "first conductive lines," "access lines," or "word lines") vertically spaced (e.g., in the Z-direction) from one another by, for example, one or more insulative structures 137.

The access devices 130 may each individually comprise a channel material 134 between a source material 136 and a drain material 138. The channel material 134 may be horizontally (e.g., in the X-direction) between the source material 136 and the drain material 138. The source material 136 and the drain material 138 may each individually comprise a semiconductive material (e.g., polysilicon) doped with at least one N-type dopant, such as one or more of arsenic ions, phosphorous ions, and antimony ions. In other embodiments, the source material 136 and the drain material 138 each individually comprise a semiconductive material doped with at least one P-type dopant, such as boron ions.

In some embodiments, the channel material 134 comprises a semiconductive material (e.g., polysilicon) doped with at least one N-type dopant or at least one P-type dopant. In some embodiments, the channel material 134 is doped with one of at least one N-type dopant and at least one P-type dopant and each of the source material 136 and the drain material 138 are each individually doped with the other of the at least one N-type dopant and the at least one P-type dopant.

The conductive structures 132 may extend horizontally (e.g., in the X-direction; FIG. 1C) through the vertical stacks of memory cells 120 as lines and may each be configured to be operably coupled to a vertically (e.g., in the Z-direction) neighboring channel material 134 of the vertically neighboring (e.g., in the Z-direction) access devices 130. In other words, a conductive structure 132 may be configured to be operably coupled to a vertically neighboring access device 130.

The conductive structures 132 may be configured to provide sufficient voltage to a channel region (e.g., channel material 134) of each of the access devices 130 to electrically couple a storage device 150 horizontally neighboring (e.g., in the Y-direction) and associated with the access device 130 to, for example, a conductive pillar structure (e.g., conductive pillar structure 160, also referred to as a "local digit line") vertically extending (e.g., in the Z-direction) through the vertical stack of access devices 130 of the vertical stack of memory cells 120. Stated another way, each conductive structure 132 may individually comprise a gate structure configured to provide a sufficient voltage to the channel material 134 vertically neighboring (e.g., in the Z-direction) the conductive structure 132 to electrically couple the access device 130 including the channel material 134 to the horizontally neighboring (e.g., in the Y-direction) storage device 150.

The vertical stack structure 135 of the conductive structures 132 including the vertically spaced conductive structures 132 may intersect the vertical stacks of memory cells 120, such as the vertical stacks of the access devices 130 of the vertical stacks of memory cells 120, each of the conductive structures 132 of the vertical stack structure 135 intersecting a level (e.g., a tier) of the memory cells 120 of the vertical stack of memory cells 120. Each conductive structure 132 may intersect and comprise a portion of a plurality of vertical stacks of access devices 130 (e.g., a gate of the access devices 130).

Figure 1D:
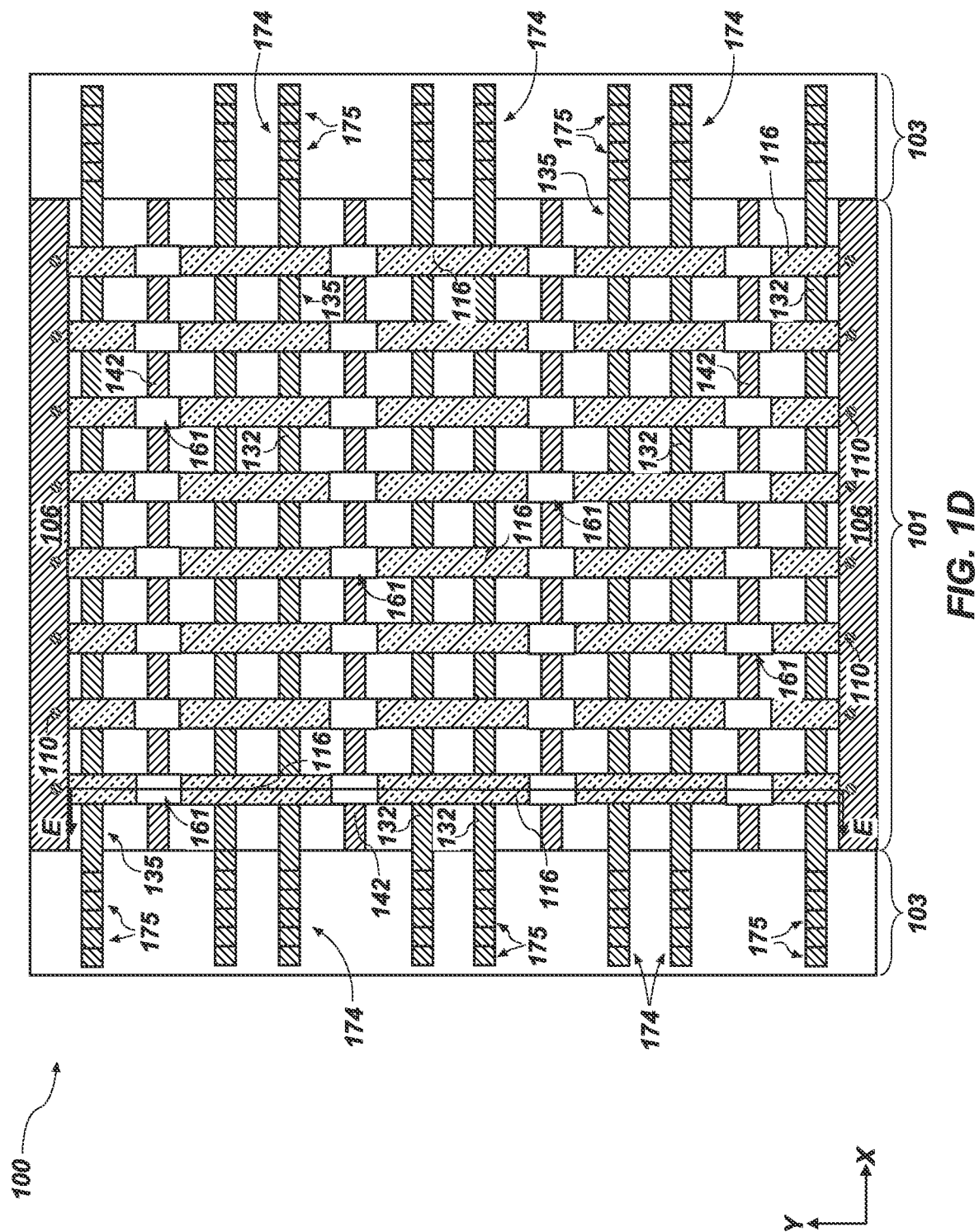
Figure 1E:
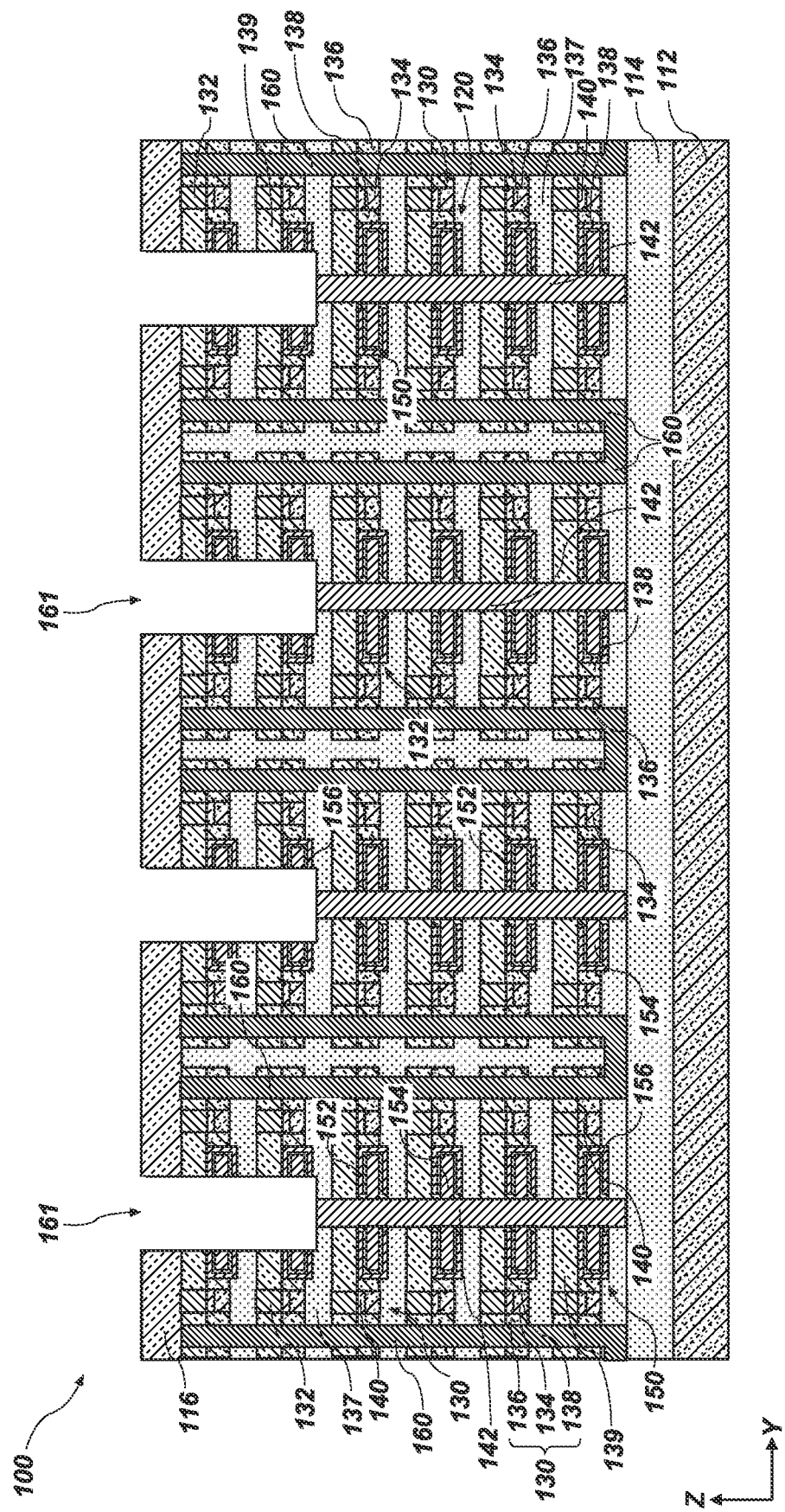
Figure 1F:
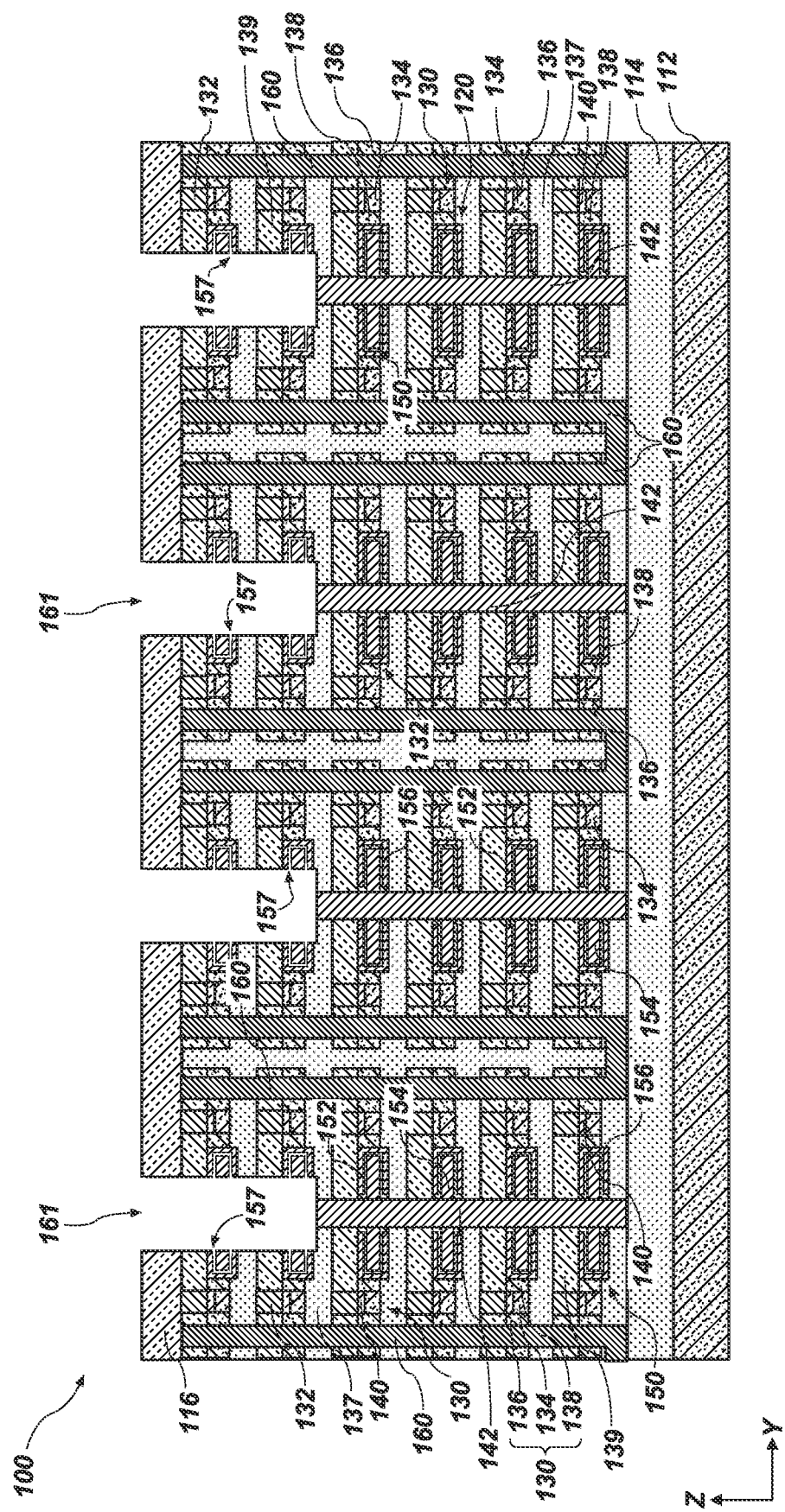
Figure 1G:
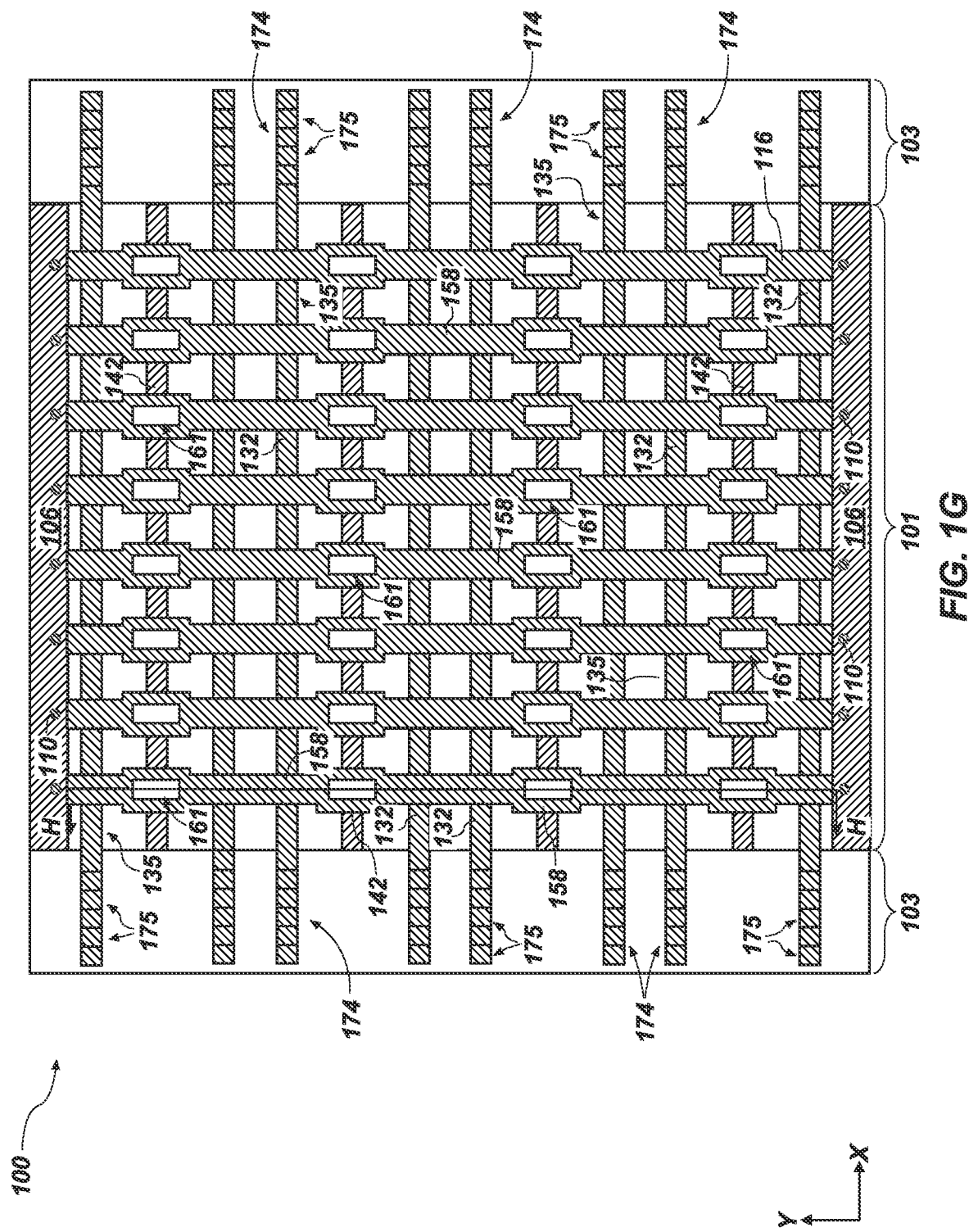
Figure 1H:
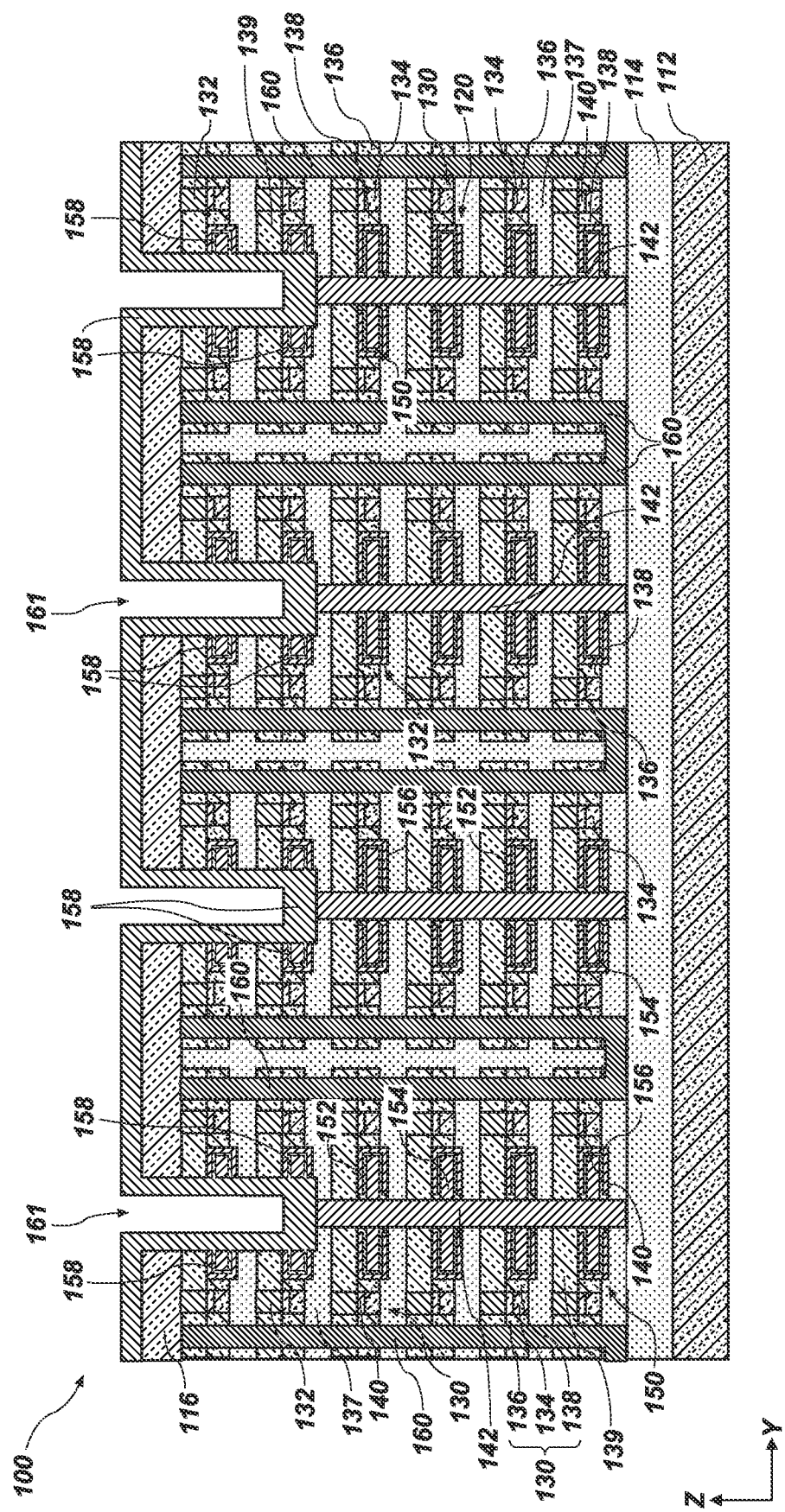
Figure 1I:
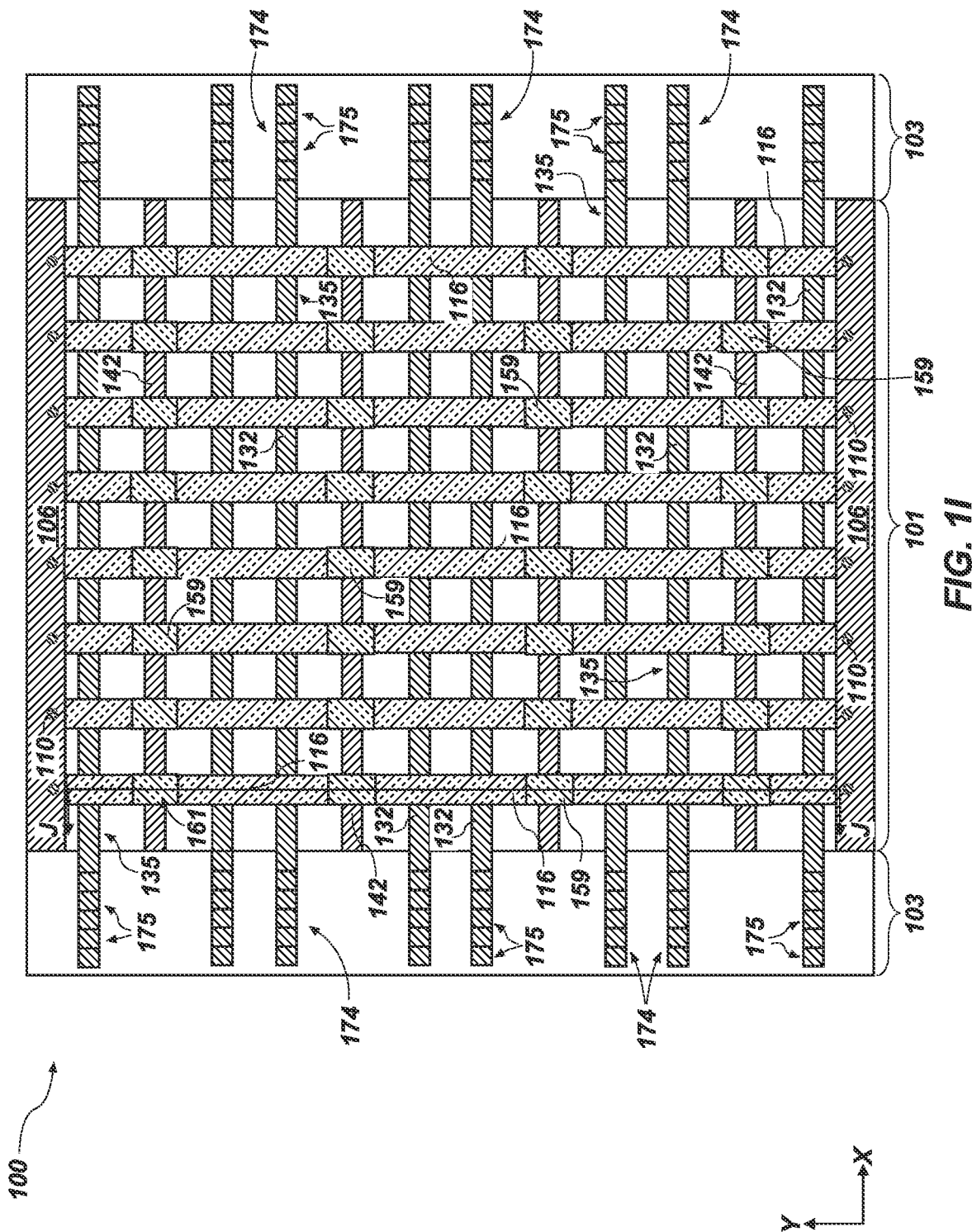
Figure 1J:
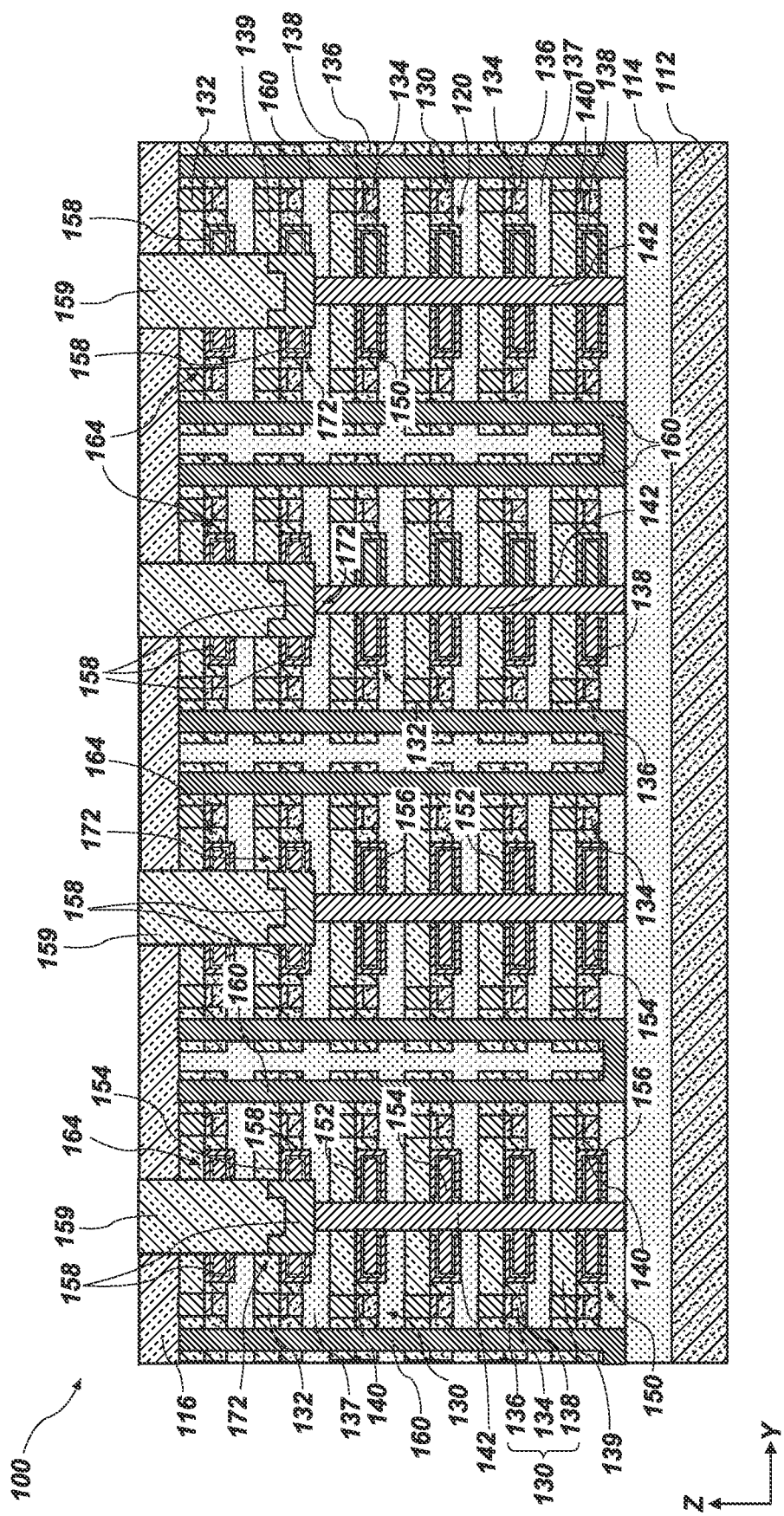
Figure 1K:
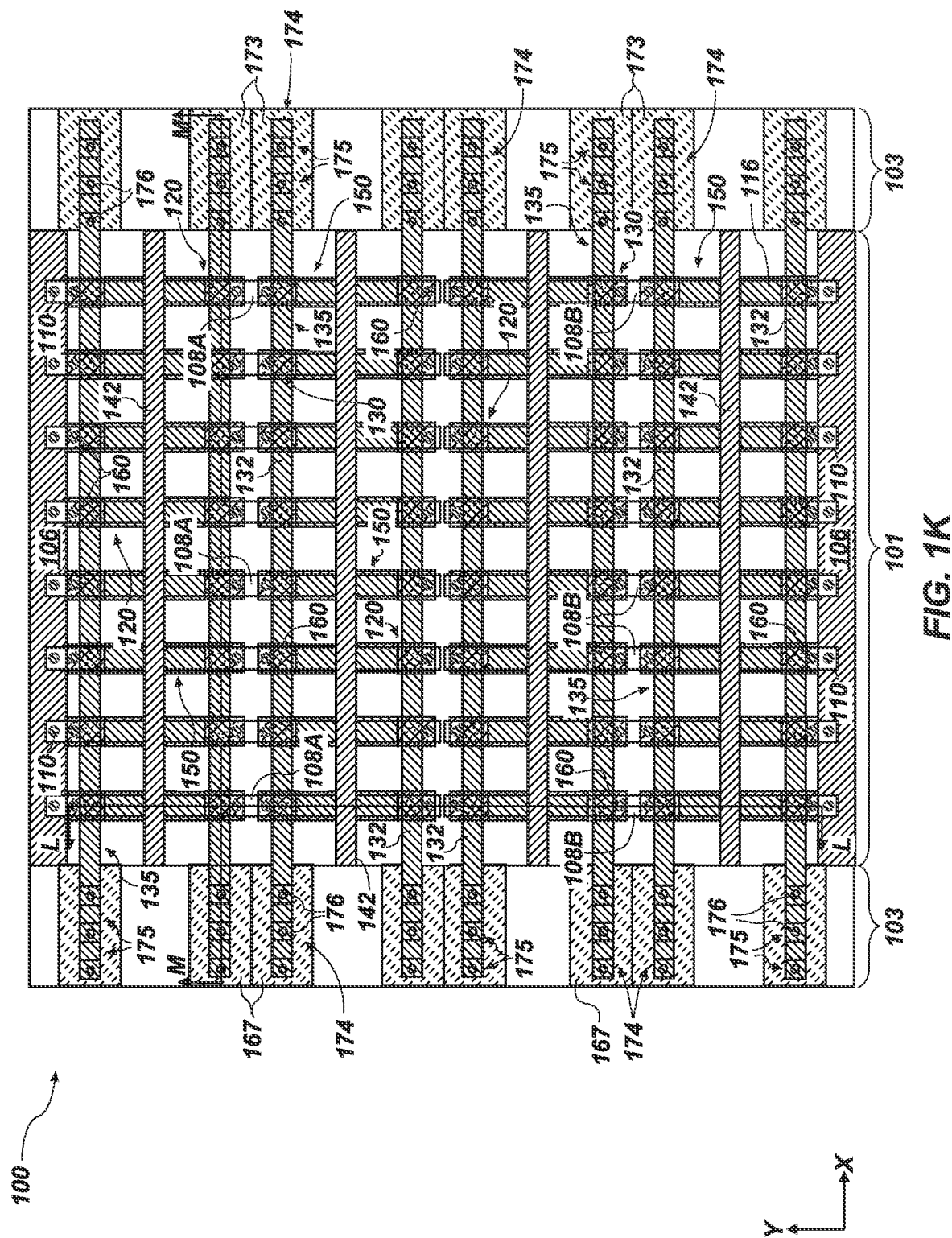

As is more clearly illustrated in FIG. 1K after removal of the mask material 116, each vertical stack structure 135 individually extends through several vertical stacks of access devices 130 of the vertical stacks of memory cells 120. In some embodiments, each vertical stack structure 135 extends through horizontally neighboring (e.g., in the X-direction) vertical stacks of memory cells 120. In some embodiments, the vertical stack structures 135 extending in a first horizontal direction (e.g., in the X-direction) are spaced from each other in a second horizontal direction (e.g., in the Y-direction).

The conductive structures 132 may individually be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the conductive structures 132 individually comprise tungsten. In other embodiments, the conductive structures individually comprise copper.

The channel material 134 may be separated from the conductive structures 132 by a dielectric material 140, which may also be referred to herein as a "gate dielectric material." In some embodiments, the portion of the conductive structure 132 directly vertically neighboring (e.g., in the Z-direction) and located within horizontal boundaries (e.g., in the X-direction, in the Y-direction) of the dielectric material 140 may be referred to as a "gate electrode." In other embodiments, the channel material 134 directly contacts a vertically neighboring conductive structure 132.

The dielectric material 140 may be formed of and include insulative material. By way of non-limiting example, the dielectric material 140 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), or a dielectric carboxynitride material (e.g., silicon carboxynitride (SiOCN)).

In some embodiments, insulative structures 137 and additional insulative structures 139 vertically (e.g., in the Z-direction) intervene between vertically neighboring access devices 130 and vertically neighboring storage devices 150. The additional insulative structures 139 may horizontally (e.g., in the Y-direction) neighbor each of the conductive structures 132. With reference to FIG. 1C, the levels of the conductive structures 132 vertically alternate with the levels of the insulative structures 137. For clarity and ease of understanding the description, in FIG. 1C, the levels of the insulative structures 137 are illustrated as comprising an integral structure. In other embodiments, the levels of the insulative structures 137 may exhibit distinct boundaries at interfaces of the levels of the conductive structures 132.

The insulative structures 137 may individually be formed of and include insulative material. In some embodiments, the insulative structures 137 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 137 comprise silicon dioxide. Each of the insulative structures 137 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 137 exhibits a substantially homogeneous distribution of insulative material. In additional embodiments, at least one of the insulative structures 137 exhibits a substantially heterogeneous distribution of at least one insulative material. The insulative structures 137 may, for example, be formed of and include a stack (e.g., laminate) of at least two different insulative materials. The insulative structures 137 may each be substantially planar, and may each individually exhibit a desired thickness.

The additional insulative structures 139 may be formed of and include an insulative material that is different than, and that has an etch selectivity with respect to, the insulative structures 137. In some embodiments, the additional insulative structures 139 are formed of and include a nitride material (e.g., silicon nitride ($Si_3N_4$)) or an oxynitride material (e.g., silicon oxynitride). In some embodiments, the additional insulative structures 139 comprise silicon nitride. In other embodiments, the additional insulative structures 139 comprise substantially the same material composition as the insulative structures 137. In some embodiments, the additional insulative structures 139 comprise silicon dioxide.

In some embodiments, the storage devices 150 are in electrical communication with a conductive plate structure 142. The conductive plate structure 142 may be formed of and include conductive material, such as one or more of the materials of an electrode (e.g., a second electrode 154) of the storage devices 150. In some embodiments, the conductive plate structure 142 comprises substantially the same material composition as an electrode of the storage devices 150. In other embodiments, the conductive plate structure 142 comprises a different material composition than the electrodes of the storage devices 150. The conductive plate structures 142 may be referred to herein as "conductive plates" or "ground structures." With reference to FIG. 1A, in some embodiments, the conductive plate structures 142 horizontally extend (e.g., in the X-direction) as conductive plates. In some embodiments, the conductive plate structures 142 horizontally extend in substantially the same direction and are substantially parallel to the conductive structures 132. Referring to FIG. 1K, the conductive plate structures 142 may be horizontally between (e.g., in the Y-direction) vertical stacks of memory cells 120, such as between vertical stacks of storage devices 150.

With reference again to FIG. 1B, one of the storage devices 150 along with neighboring structures are illustrated in enlarged box 155. In some embodiments, each of the storage devices 150 individually comprises a first electrode 152 (also referred to herein as an "outer electrode," "a first electrode plate," or a "first node structure"), a second electrode 154 (also referred to herein as an "inner electrode," "a second electrode plate," or a "second node structure"), and a dielectric material 156 between the first electrode 152 and the second electrode 154. In some such embodiments, the storage devices 150 individually comprise capacitors. However, the disclosure is not so limited and in other embodiments, the storage devices 150 may each individually comprise other structures, such as, for example, phase change memory (PCM), resistance random-access memory (RRAM), conductive-bridging random-access memory (conductive bridging RAM), or another structure for storing a logic state.

The first electrode 152 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium), polysilicon, and other materials exhibiting electrical conductivity. In some embodiments, the first electrode 152 comprises titanium nitride.

The second electrode 154 may be formed of and include conductive material. In some embodiments, the second electrode 154 comprises one or more of the materials described above with reference to the first electrode 152. In some embodiments, the second electrode 154 comprises substantially the same material composition as the first electrode 152.

The dielectric material 156 may be formed of and include one or more of silicon dioxide ($SiO_2$), silicon nitride ($Si_3N_4$), polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT)), and a high-k dielectric material.

The second electrode 154 may be in electrical communication with one of the conductive plate structures 142 of a vertical stack of memory cells 120. In some embodiments, the second electrodes 154 are substantially integral with the conductive plate structures 142. Referring to FIG. 1K, in some embodiments, the second electrodes 154 (FIG. 1B) of horizontally neighboring (e.g., in the X-direction) vertical stacks of storage devices 150 are in electrical communication with the same conductive plate structure 142. In some embodiments, the conductive plate structures 142 are individually formed of conductive material, such as one or more of the materials of the second electrode 154. In some embodiments, the conductive plate structures 142 comprise substantially the same material composition as the second electrode 154. In other embodiments, the conductive plate structures 142 comprise a different material composition than the second electrode 154.

With continued reference to FIG. 1B, the first microelectronic device structure 100 may include conductive pillar structures 160 vertically extending (e.g., in the Z-direction) through the first microelectronic device structure 100. The conductive pillar structures 160 may also be referred to herein as "digit lines," "second conductive lines," "digit line pillar structures," "local digit lines," or "vertical digit lines." Each conductive pillar structure 160 vertically extends through access devices 130 of a vertical stack of memory cells 120. The conductive pillar structures 160 may be electrically coupled to the access devices 130 to facilitate operation of the memory cells 120 of a vertical stack of memory cells 120. As described above, application of a voltage to a conductive structure 132 vertically neighboring (e.g., in the Z-direction) the channel material 134 of a vertically neighboring access device 130 may induce a current through the channel material 134 to electrically connect the conductive pillar structure 160 to the storage device 150 horizontally neighboring (e.g., in the Y-direction) the access device 130.

In some embodiments, the vertically uppermost (e.g., in the Z-direction) levels (e.g., the vertically uppermost two (2) levels) of the memory cells 120 may comprise so-called "dummy tiers" or "dummy memory cells." As described in further detail herein, in some embodiments, at least a portion of the vertically uppermost two levels of memory cells 120 are replaced with conductive material to form electrical connections between the access devices 130 of such levels and another component of a microelectronic device (e.g., microelectronic device 300 (FIG. 3A)) including the first microelectronic device structure 100.

The conductive pillar structures 160 may individually be formed of and include conductive material, such as one or more of a metal (e.g., one or more of tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the conductive pillar structures 160 comprise tungsten.

With reference to FIG. 1A and FIG. 1C, the conductive structures 132 of the vertical stack structure 135 may horizontally (e.g., in the X-direction) terminate at staircase structures 174 located at horizontally (e.g., in the X-direction) terminal portions of the vertical stack structure 135. While the staircase structures 174 are illustrated in FIG. 1A, it will be understood that the staircase structures 174 are located beneath a vertically upper (e.g., in the Z-direction) surface of the first microelectronic device structure 100 and the mask material 116. With reference to FIG. 1C, vertically higher (e.g., in the Z-direction) conductive structures 132 may have a smaller horizontal dimension (e.g., in the X-direction) than vertically lower conductive structures 132, such that horizontal edges of the conductive structures 132 at least partially define steps 175 of the staircase structures 174. In some embodiments, the memory cells 120 of the vertical stack of memory cells 120 that are vertically higher (e.g., in the Z-direction) than other memory cells 120 comprise and are intersected by conductive structures 132 having a smaller horizontal dimension (e.g., in the X-direction) than conductive structures 132 of vertically lower memory cells 120 of the vertical stacks of memory cells 120.

With reference to FIG. 1A, in some embodiments, the staircase structures 174 of each of the vertical stack structure 135 are horizontally aligned in a first direction (e.g., in the X-direction) and horizontally offset in a second direction (e.g., the Y-direction). In some such embodiments, each vertical stack structure 135 individually includes a staircase structure 174 at a first horizontal end (e.g., in the X-direction) of the vertical stack structure 135 and an additional staircase structure 174 at a second, opposite horizontal end (e.g., in the X-direction) of the vertical stack structure 135.

In other embodiments, the staircase structures 174 of horizontally neighboring (e.g., in the Y-direction) vertical stack structure 135 may be located at opposing horizontal ends (e.g., in the X-direction) of the first microelectronic device structure 100. In some such embodiments, every other vertical stack structure 135 (e.g., in the Y-direction) includes a staircase structure 174 at a first horizontal end (e.g., in the X-direction) of the first microelectronic device structure 100 while the other of the vertical stack structures 135 individually includes a staircase structure 174 at a second horizontal end (e.g., in the X-direction) of the first microelectronic device structure 100 opposite the first horizontal end. Stated another way, the staircase structures 174 of horizontally neighboring (e.g., in the Y-direction) vertical stack structures 135 may alternate between a first horizontal end (e.g., in the X-direction) of the first microelectronic device structure 100 and a second horizontal end (e.g., in the X-direction) of the first microelectronic device structure 100, the second horizontal end opposing the first horizontal end.

Although FIG. 1A illustrates two staircase structures 174 for every vertical stack structure 135 (e.g., a staircase structure 174 at each horizontal end (e.g., in the X-direction) of each vertical stack structure 135), the disclosure is not so limited. In other embodiments, each vertical stack structure 135 may include one staircase structure 174, and each of the staircase structures 174 may be located at a same horizontal end (e.g., in the X-direction) of the vertical stack structures 135.

The quantity of the steps 175 of the staircase structures 174 may correspond to the quantity of the levels of memory cells 120 of the vertical stack structure 135 (minus one level for the multiplexers 166 and one level for the transistors 170). Although FIG. 1A and FIG. 1C illustrate that the staircase structures 174 individually comprise a particular number (e.g., six (6)) steps 175, the disclosure is not so limited. In other embodiments, the staircase structures 174 each individually include a desired quantity of the steps 175, such as within a range from thirty-two (32) of the steps 175 to two hundred fifty-six (256) of the steps 175. In some embodiments, the staircase structures 174 each individually include sixty-four (64) of the steps 175. In other embodiments, the staircase structures 174 each individually include ninety-six (96) or more of the steps 175. In other embodiments, the staircase structures 174 each individually include a different number of the steps 175, such as less than sixty-four (64) of the steps 175 (e.g., less than or equal to sixty (60) of the steps 175, less than or equal to fifty (50) of the steps 175, less than about forty (40) of the steps 175, less than or equal to thirty (30) of the steps 175, less than or equal to twenty (20) of the steps 175, less than or equal to ten (10) of the steps 175); or greater than sixty-four (64) of the steps 175 (e.g., greater than or equal to seventy (70) of the steps 175, greater than or equal to one hundred (100) of the steps 175, greater than or equal to about one hundred twenty-eight (128) of the steps 175, greater than two hundred fifty-six (256) of the steps 175).

In some embodiments, the staircase structures 174 each individually include the same quantity of the steps 175. In some such embodiments, staircase structures 174 of the same vertical stack structure 135 include the same quantity of the steps 175. In some embodiments, each step 175 of each staircase structure 174 of a vertical stack structure 135 may be vertically offset (e.g., in the Z-direction) from a vertically neighboring step 175 of the staircase structure 174 by one level (e.g., one tier) of the vertically alternating conductive structures 132 and insulative structures 137. In some such embodiments, every conductive structure 132 of the vertical stack structure 135 may comprise a step 175 at each horizontal end (e.g., in the X-direction) of the staircase structures 174 of the vertical stack structure 135. In other embodiments, vertically neighboring (e.g., in the Z-direction) steps 175 of a staircase structure 174 on a first horizontal size (e.g., in the X-direction) of a vertical stack structure 135 may be vertically offset (e.g., in the Z-direction) by two levels (e.g., two tiers) of the vertically alternating conductive structures 132 and insulative structures 137. In some such embodiments, the steps 175 of each staircase structure 174 are formed of every other conductive structure 132 of the vertical stack structure 135 and the steps 175 of staircase structures 174 at horizontally opposing ends (e.g., in the X-direction) of the same vertical stack structure 135 may be defined by conductive structures 132 that are vertically spaced (e.g., in the Z-direction) from one another by one level of a conductive structure 132 and an insulative structure 137.

FIG. 1D and FIG. 1E illustrate the first microelectronic device structure 100 at a processing stage later than the one illustrated in FIG. 1A through FIG. 1C. FIG. 1E is a simplified partial cross-sectional view of the first microelectronic device structure 100 taken through section line E-E of FIG. 1D and illustrated the same cross-sectional view illustrated in FIG. 1B.

With collective reference to FIG. 1D and FIG. 1E, openings 161 may be formed in portions of the mask material 116 vertically overlying (e.g., in the Z-direction) portions of the conductive plate structures 142 electrically connected to horizontally neighboring (e.g., in the X-direction) storage devices 150 of horizontally neighboring (e.g., in the X-direction) vertical stacks of memory cells 120.

Portions of the insulative structures 137, the additional insulative structures 139, the conductive plate structures 142, and the storage devices 150 of at least the vertically uppermost (e.g., in the Z-direction) levels of the vertical stacks of memory cells 120 may be removed through the openings 161. The portions of the insulative structures 137, the additional insulative structures 139, the conductive plate structures 142, and the storage devices 150 may be removed by exposing the insulative structures 137, the additional insulative structures 139, the conductive plate structures 142, and the storage devices 150 to one or more etch chemistries, such as one or more dry etch chemistries. In some embodiments, the portions of the insulative structures 137, the additional insulative structures 139, the conductive plate structures 142, and the storage devices 150 are removed by reactive ion etching (RIE).

With reference to FIG. 1D and FIG. 1E, in some embodiments, a horizontal dimension in a first horizontal direction (e.g., in the Y-direction) of the openings 161 may be greater than a horizontal dimension in a second horizontal dimension (e.g., in the X-direction). In some embodiments, a horizontal dimension of the openings 161 may be greater in a direction substantially perpendicular to the direction in which the conductive plate structures 142 extend (e.g., in the Y-direction). In some such embodiments, a horizontal dimension of the openings 161 may be shorter in a direction substantially parallel with the conductive structures 132 (e.g., in the X-direction) than in a horizontal direction substantially perpendicular (e.g., in the Y-direction) to the horizontal direction in which the conductive structures extend 132.

With continued reference to FIG. 1D and FIG. 1E, in some embodiments, the openings 161 may have a horizontal dimension (e.g., in the Y-direction) greater than a horizontal dimension (e.g., in the Y-direction) of the conductive plate structures 142. Since the openings 161 may exhibit a larger dimension in a first horizontal direction (e.g., the Y-direction) than in a second horizontal direction (e.g., the X-direction), the openings 161 may be referred to herein as "elongated openings."

In some embodiments, the openings 161 may expose an upper surface of the conductive plate structures 142 intersecting the vertical stacks of memory cells 120 and a portion of, for example, one of the insulative structures 137. For clarity and ease of understanding the description, the exposed portions of the conductive plate structures 142 and the insulative structures 137 are not illustrated in the openings 161 in FIG. 1D.

FIG. 1F is a simplified partial cross-sectional view of the first microelectronic device structure 100 illustrated the same cross-sectional view as that illustrated in FIG. 1E at a processing stage subsequent to that illustrated in FIG. 1E. With reference to FIG. 1F, the dielectric material 156 of the storage devices 150 exposed through the openings 161 may selectively be removed relative to the first electrode 152 and the second electrode 154 of the storage devices 150. In other words, the first electrode 152 and the second electrode 154 of the storage devices 150 exposed through the openings 161 may not be substantially removed. In some embodiments, the dielectric material 156 is removed from the vertically uppermost (e.g., in the Z-direction) two of the storage devices 150. In some embodiments, the dielectric material 156 is partially removed such that at least a portion of the dielectric material 156 remains between the first electrode 152 and the second electrode 154.

Selective removal of the dielectric material 156 relative to the first electrode 152 and the second electrode 154 may leave voids 157 in spaces between the first electrode 152 and the second electrode 154 corresponding to the location of the dielectric material 156 prior to removal thereof.

By way of non-limiting example, in some embodiments, the first microelectronic device structure 100 may be exposed to one or more wet etchants to selectively remove the dielectric material 156 relative to the first electrode 152 and the second electrode 154. The one or more wet etchants may include, for example, one or more of phosphoric acid ($H_3PO_4$), ammonium hydroxide ($NH_4OH$), hydrogen peroxide ($H_2O_2$), hydrogen chloride (HCl), hydrofluoric acid (HF), and tetramethyl ammonium hydroxide ($C_4H_{13}NO$) (TMAH). However, the disclosure is not so limited and the dielectric material 156 may be removed selective to the first electrode 152 and the second electrode 154 by exposing the dielectric material 156 to one or more different chemistries than those described.

FIG. 1G and FIG. 1H illustrate the first microelectronic device structure 100 at a processing stage later than the one illustrated in FIG. 1F. FIG. 1H is a simplified partial cross-sectional view of the first microelectronic device structure 100 taken through section line H-H of FIG. 1G and illustrates the same cross-sectional view illustrated in FIG. 1F.

With collective reference to FIG. 1G and FIG. 1H, a conductive material 158 may be formed within the voids 157 (FIG. 1F) and at least within at least a portion of the individual openings 161. In some embodiments, the conductive material 158 within the voids 157 is in electrical connection with (e.g., is electrically shorted to) the conductive material of the first electrode 152 to the conductive material of the second electrode 154. In addition, the conductive material 158 within a vertically lowermost (e.g., in the Z-direction) storage device 150 from which the dielectric material 156 was removed may be in electrical communication with (e.g., electrically shorted to) a horizontally neighboring (e.g., in the Y-direction) conductive plate structure 142. Stated another way, the conductive material 158 may electrically connect the conductive plate structure 142 to the first electrodes 152 and the second electrodes 154 exposed after removal of the dielectric material 156.

The conductive material 158 may be formed by deposition, such as by CVD. The conductive material 158 may be formed of and include conductive material, such as one or more of the materials described above with reference to the conductive pillar structures 160. In some embodiments, the conductive material 158 comprises titanium. In other embodiments, the conductive material 158 comprises titanium nitride. In yet other embodiments, the conductive material 158 comprises copper. In further embodiments, the conductive material 158 comprises tungsten.

FIG. 1I and FIG. 1J illustrate the first microelectronic device structure 100 at a processing stage later than the one illustrated in FIG. 1G and FIG. 1H. FIG. 1J is a simplified partial cross-sectional view of the first microelectronic device structure 100 taken through section line J-J of FIG. 1I and illustrates the same cross-sectional view illustrated in FIG. 1H.

With collective reference to FIG. 1I and FIG. 1J, portions of the conductive material 158 within the openings 161 (FIG. 1G, FIG. 1H) may be removed (e.g., recessed). Vertically upper (e.g., in the Z-direction) portions of the conductive material 158 may be removed (e.g., recessed) from the openings 161 while vertically lower (e.g., in the Z-direction) portions of the conductive material 158 remain. In some embodiments, the conductive material 158 may remain horizontally between and electrically connected to each of the first electrodes 152 and the second electrodes 154 of the individually storage devices 150 from which the dielectric material 156 was removed. In other words, the conductive material 158 may remain horizontally between and electrically connecting the first electrodes 152 and the second electrodes 154 of the vertically lowermost storage devices 150 exposed through the openings 161. In some embodiments, removal of portions of the conductive material 158 from vertically upper (e.g., in the Z-direction) portions of openings 161 may form isolated conductive structures 164 from the vertically uppermost (e.g., in the Z-direction) storage devices 150 and an additional conductive structure 172 comprising the conductive material 158 and the storage devices 150 vertically below (e.g., in the Z-direction) the vertically uppermost storage devices 150 (e.g., the second from the top storage devices 150). In some embodiments, for every one of the additional conductive structures 172, the first microelectronic device structure 100 may include two isolated conductive structures 164.

Each of the isolated conductive structures 164 may individually comprise a portion of the conductive material 158 vertically between (e.g., in the Z-direction) and horizontally between (e.g., in the X-direction, in the Y-direction) the first electrodes 152 and the second electrodes 154 of the vertically uppermost (e.g., in the Z-direction) levels of the storage devices 150. The isolated conductive structures 164 may individually be electrically isolated from one another and from the vertically underlying (e.g., in the Z-direction) additional conductive structure 172. The isolated conductive structures 164 may be formed on each horizontal side (e.g., in the Y-direction) of the openings 161. In some embodiments, such as where the conductive pillar structures 160 are electrically connected to each other at vertically lower (e.g., in the Z-direction) portions of the vertical stacks of memory cells 120, each vertical stack of memory cells 120 may include two of the isolated conductive structures 164. In some embodiments, each vertical stack of memory cells 120 may include one of the isolated conductive structures 164, such as where the conductive pillar structures 160 are electrically isolated from one another.

In some embodiments, each of the additional conductive structures 172 horizontally extends (e.g., in the Y-direction) from a storage device 150 of a vertical stack of storage devices 150, over a conductive plate structure 142 and to a storage device 150 of a horizontally neighboring (e.g., in the Y-direction) vertical stack of storage devices 150. The additional conductive structures 172 may individually comprise two of the first electrodes 152, two of the second electrodes 154, and the conductive material 158 electrically connecting the first electrodes 152 and the second electrodes 154. In some embodiments, the conductive material 158 of the additional conductive structures 172 comprises a different material composition than each of the first electrodes 152 and the second electrodes 154. In other embodiments, the conductive material 158 of the additional conductive structures 172 comprises substantially the same material composition as each of the first electrodes 152 and the second electrodes 154.

The portions of the conductive material 158 may be selectively removed by exposing the conductive material 158 to one or more dry etch chemistries. By way of non-limiting example, in some embodiments, the conductive material 158 may be exposed to one or more of carbon tetrafluoride ($CF_4$), hexafluoroethane ($C_2F_6$), perfluorocyclobutane (also referred to as octafluorocyclobutane) ($C_4F_8$), chlorine ($Cl_2$), oxygen and hydrogen fluoride (HF) and sulfur hexafluoride ($SF_6$). However, the disclosure is not so limited and the portions of the conductive material 158 may be removed by exposing the conductive material 158 to one or more other materials.

After removing portions of the conductive material 158 and forming the isolated conductive structures 164 and the additional conductive structures 172, portions of the openings 161 (FIG. 1G, FIG. 1H) vertically overlying (e.g., in the Z-direction) the additional conductive structure 172 may be filled with a second insulative material 159.

The second insulative material 159 may be formed of and include insulative material, such as one or more of the materials described above with reference to the first insulative material 114. In some embodiments, the second insulative material 159 comprises substantially the same material composition as the first insulative material 114. In some embodiments, the second insulative material 159 comprises silicon dioxide.

After forming the second insulative material 159, the first microelectronic device structure 100 may be exposed to a chemical mechanical planarization (CMP) process to remove portions of the second insulative material 159 outside of the openings 161 (FIG. 1G, FIG. 1H) and expose upper surfaces (e.g., in the Z-direction) of the mask material 116.

Figure 1L:
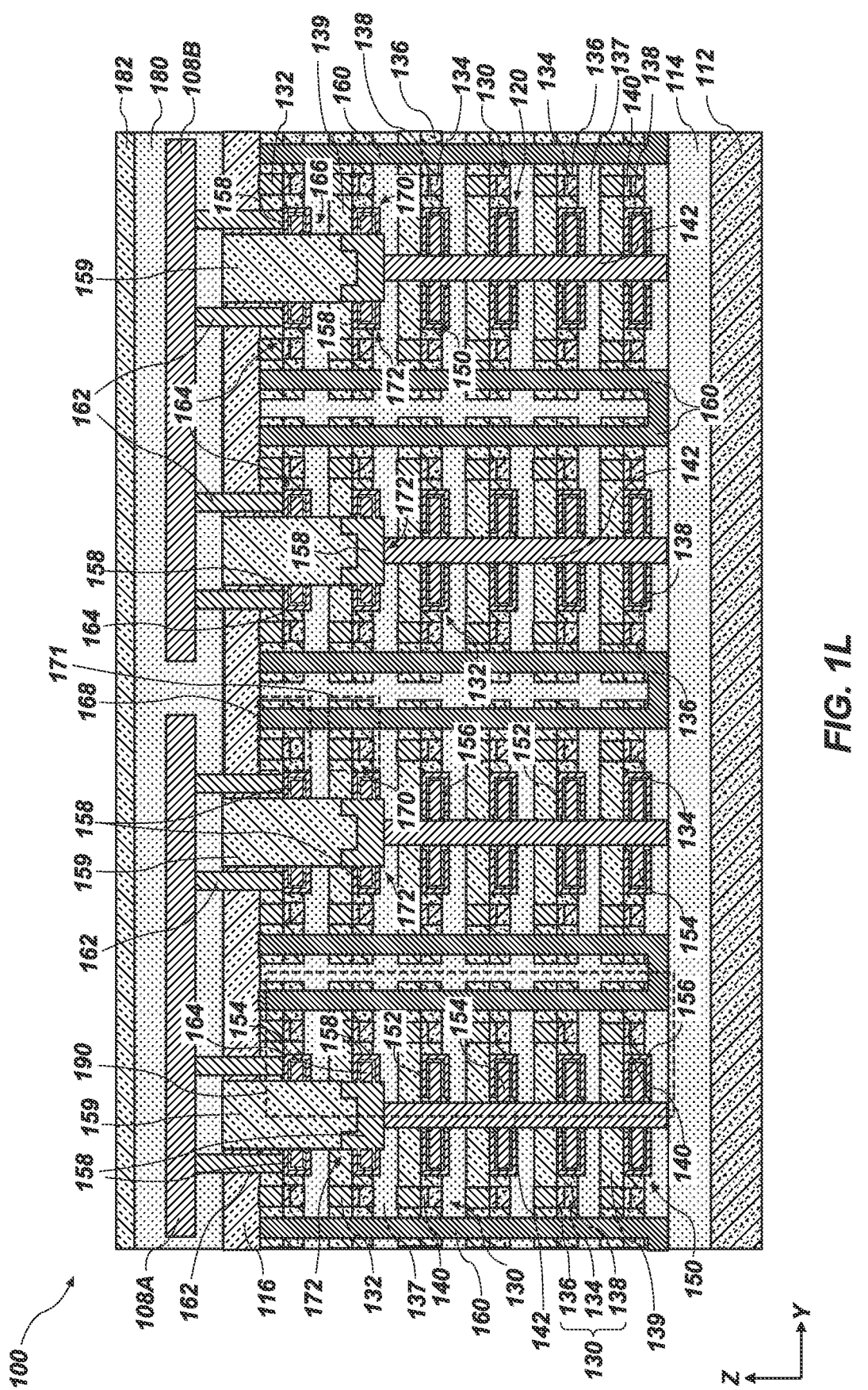
Figure 1M:
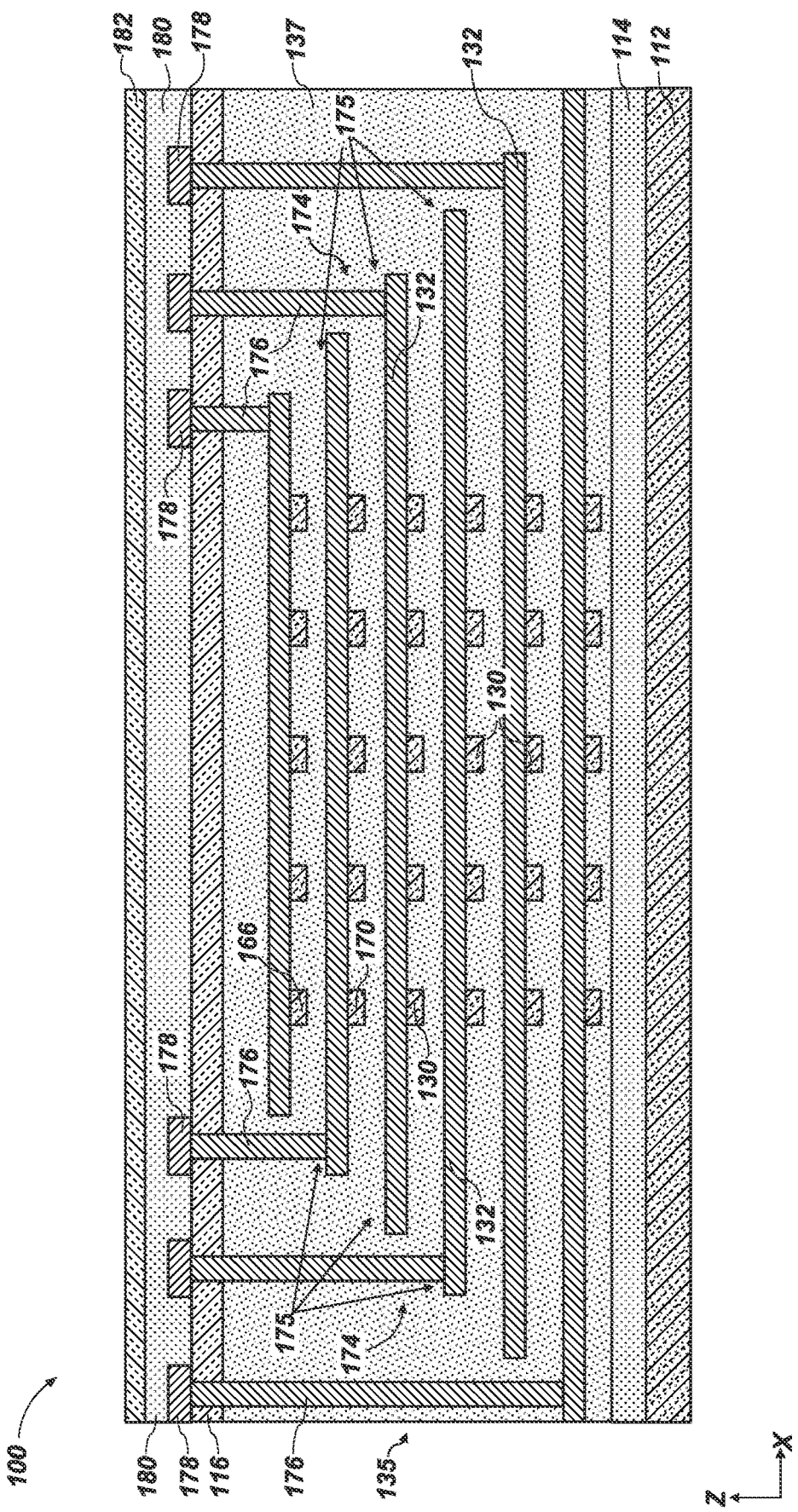

FIG. 1K through FIG. 1M illustrate the first microelectronic device structure 100 at a processing stage later than the one illustrated in FIG. 1I and FIG. 1J. FIG. 1L is a simplified partial cross-sectional view of the first microelectronic device structure 100 taken through section line L-L of FIG. 1K and illustrates the same cross-sectional view illustrated in FIG. 1J. FIG. 1M is a simplified partial cross-sectional view of the first microelectronic device structure 100 taken through section line M-M of FIG. 1K and illustrates the same cross-sectional view illustrated in FIG. 1C.

With collective reference to FIG. 1K through FIG. 1M, global digit line contact structures 162 (FIG. 1L) may be formed in electrical communication with the isolated conductive structures 164 and global digit lines 108A, 108B (FIG. 1K, FIG. 1L) may be formed over the global digit line contact structures 162 and in electrical communication with the isolated conductive structures 164 by means of the global digit line contact structures 162. In addition, conductive contact structures 176 (FIG. 1K, FIG. 1M) may be formed in electrical communication with individual steps 175 (FIG. 1K, FIG. 1M) of the staircase structures 174 (FIG. 1K, FIG. 1M) and pad structures 178 (FIG. 1M) may be formed in electrical communication with the conductive contact structures 176.

With reference to FIG. 1M, in some embodiments, openings may be formed through the mask material 116 and the insulative structures 137 vertically overlying (e.g., in the Z-direction) the staircase structures 174 to expose at least a portion of each of the steps 175. After exposing the portions of the steps 175, the openings may be filled with a conductive material to form the conductive contact structures 176.

With continued reference to FIG. 1M, the conductive contact structures 176 may be in electrical communication with individual conductive structures 132 at the steps 175.

For example, the conductive contact structures 176 may individually physically contact (e.g., land on) portions of upper surfaces of the conductive structures 132 at least partially defining treads of the steps 175. In some embodiments, every other step 175 of each staircase structure 174 may be in electrical communication with a conductive contact structure 176. In some such embodiments, each vertical stack structure 135 includes one staircase structure 174 at each horizontal (e.g., in the X-direction) end thereof and every other step 175 of each staircase structure 174 is individually in contact with a conductive contact structure 176. Each conductive structure 132 of a first staircase structure 174 at a first horizontal end of the vertical stack structure 135 not in electrical communication with a conductive contact structure 176 may individually be in electrical communication with a conductive contact structure 176 at steps 175 of a second staircase structure 174 at a second, opposite horizontal end of the vertical stack structure 135. In other embodiments, each step 175 of each staircase structure 174 may be in electrical communication with a conductive contact structure 176 at the horizontal (e.g., in the X-direction) end of the staircase structure 174.

The conductive contact structures 176 may individually be formed of and include conductive material, such as one or more of the materials described above with reference to the conductive pillar structures 160. In some embodiments, the conductive contact structures 176 comprise substantially the same material composition as the conductive pillar structures 160. In other embodiments, the conductive contact structures 176 comprise a different material composition than the conductive pillar structures 160. In some embodiments, the conductive contact structures 176 comprise tungsten.

After forming the conductive contact structures 176, pad structures 178 may be formed vertically overlying (e.g., in the Z-direction) and in electrical communication with the conductive contact structures 176. In some embodiments, each of the conductive contact structures 176 is individually in electrical communication with one of the pad structures 178. The pad structures 178 may be formed within a third insulative material 180.

The pad structures 178 may individually be formed of and include conductive material, such as one or more of the materials described above with reference to conductive structures 132. In some embodiments, the pad structures 178 are formed of and include tungsten. In other embodiments, the pad structures 178 are formed of and include copper.

With reference to FIG. 1K and FIG. 1L, within the array region 101, openings may be formed within the mask material 116 and the additional insulative structure 139 vertically overlying the isolated conductive structures 164 to expose at least a portion of each of the isolated conductive structures 164. In some embodiments, a portion of the first electrode 152 of each of the isolated conductive structures 164 is exposed. The openings may be filled with conductive material to form the global digit line contact structures 162 in electrical communication with the isolated conductive structures 164.

While FIG. 1L illustrates that each of the isolated conductive structures 164 is in electrical communication with a global digit line contact structure 162, the disclosure is not so limited. In other embodiments, every other one of the isolated conductive structures 164 is in electrical communication with a global digit line contact structure 162. By way of non-limiting example, in some embodiments, one of the two isolated conductive structures 164 vertically overlying (e.g., in the Z-direction) and within horizontal boundaries (e.g., in the X-direction, in the Y-direction) an individual additional conductive structure 172 is in electrical communication with a global digit line contact structure 162 while the other isolated conductive structures 164 is not in electrical communication with a global digit line contact structure 162. In some such embodiments, since the conductive pillar structures 160 of horizontally neighboring (e.g., in the Y-direction) vertical stacks of memory cells 120 are connected, only one isolated conductive structure 164 is in electrical communication with a global digit line contact structure 162 since electrical connection of the isolated conductive structure 164 with the global digit line 108A, 108B electrically connects the conductive pillar structures 160 of the electrically connected and horizontally neighboring vertical stacks of memory cells 120 to the global digit line 108A, 108B.

The global digit line contact structures 162 may individually be formed of and include conductive material, such as one or more of the materials described above with reference to the conductive structures 132. In some embodiments, the global digit line contact structures 162 individually comprise tungsten. In other embodiments, the global digit line contact structures 162 individually comprise copper. In some embodiments, the global digit line contact structures 162 comprise substantially the same material composition as the isolated conductive structures 164 (e.g., at least a portion of the isolated conductive structures 164 (e.g., the first electrode 152, the second electrode 154, the conductive material 158)).

In some embodiments, the global digit line contact structures 162 and the isolated conductive structures 164 individually comprise a material exhibiting a relatively low resistance value to facilitate an increased speed (e.g., low RC delay) of data transmission. In some embodiments, the global digit line contact structures 162 and the isolated conductive structures 164 individually comprise titanium nitride.

After forming the global digit line contact structures 162, global digit lines 108 (including global digit lines 108A and global digit lines 108B) (also collectively referred to as global digit lines 108A, 108B) may be formed vertically over (e.g., in the Z-direction) and in electrical communication with the global digit line contact structures 162. The global digit lines 108A, 108B may also be referred to as "conductive lines." With collective reference to FIG. 1K and FIG. 1L, the global digit lines 108A, 108B are located within the array region 101 and extend in a horizontal direction (e.g., the Y-direction) substantially perpendicular to the conductive structures 132 and the vertical stack structures 135. The global digit lines 108A, 108B may terminate at horizontally terminal ends (e.g., in the Y-direction) of the array region 101 within second conductive contact exit regions 106. Each of the global digit lines 108A, 108B may individually be in electrical communication with a conductive contact structure 110 (FIG. 1K) at a horizontal end (e.g., in the Y-direction) of the global digit lines 108A, 108B within one of the second conductive contact exit regions 106.

The global digit lines include first global digit lines 108A and second global digit lines 108B. The first global digit lines 108A may be referred to herein as "through global digit lines" and the second global digit lines 108B may be referred to herein as "reference global digit lines." The first global digit lines 108A and the second global digit lines 108B may collectively be referred to herein as "global digit lines." In some embodiments, the first global digit lines 108A are located on a first horizontal end (e.g., in the Y-direction) of the first microelectronic device structure 100 and the second global digit lines 108B are located on a second horizontal end (e.g., in the Y-direction) of the first microelectronic device structure 100 opposite the first horizontal end. For example, in the view illustrated in FIG. 1A, the first global digit lines 108A may be located in the upper horizontal half (e.g., in the Y-direction) of the array region 101 and the second global digit lines 108B may be located in a lower horizontal half (e.g., in the Y-direction) of the array region 101. The first global digit lines 108A and the second global digit lines 108B may be collectively referred to herein as global digit lines.

Each of the global digit lines 108A, 108B and the conductive contact structures 110 may individually be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the global digit lines 108A, 108B and the conductive contact structures 110 individually comprise tungsten. In other embodiments, the global digit lines 108A, 108B and the conductive contact structures 110 individually comprise copper.

With continued reference to FIG. 1L, the global digit lines 108A, 108B may vertically overlie (e.g., in the Z-direction) the vertical stacks of memory cells 120. In some embodiments, the vertical stacks of memory cells 120, the vertical stack structures 135, and the staircase structures 174 are vertically closer (e.g., in the Z-direction) to the first base structure 112 than the global digit lines 108A, 108B. In some embodiments, the global digit lines 108A, 108B are located vertically closer (e.g., in the Z-direction) to conductive structures 132 having a relatively shorter horizontal dimension (e.g., in the X-direction) than conductive structures 132 having a relatively greater horizontal dimension (e.g., in the X-direction).

The global digit lines 108A, 108B may be formed within the third insulative material 180. In some embodiments, the global digit lines 108A, 108B and at least a portion of each of the global digit line contact structures 162 may be formed within the first insulative material 114.

In some embodiments, an access device 130 horizontally neighboring the isolated conductive structures 164 may comprise a multiplexer 166, one of which is illustrated in box 168 of FIG. 1L. In some embodiments, the each global digit line 108A, 108B (FIG. 1K, FIG. 1L) may be in electrical communication with one or more global digit line contact structures 162 that are, in turn, individually in electrical communication with an isolated conductive structure 164 to selectively couple the respective global digit line 108A, 108B to one of the conductive pillar structures 160 through a multiplexer 166, illustrated in box 168. In some embodiments, each of the vertically uppermost (e.g., in the Z-direction) access devices 130 of the vertical stacks of access devices 130 individually comprises a multiplexer 166. In some embodiments, the multiplexers 166 facilitate selective provision of a voltage from a conductive pillar structure 160 to which it is electrically connected (by means of the global digit line contact structures 162) to selectively provide the voltage of the conductive pillar structure 160 to the global digit line 108A, 108B through the multiplexer 166. In other words, the global digit lines 108A, 108B are configured to be selectively electrically connected to the conductive pillar structures 160 by means of the multiplexers 166. Accordingly, the global digit lines 108A, 108B are configured to be selectively electrically connected to conductive pillar structures 160 vertically extending (e.g., in the Z-direction) through a respective vertical stack of memory cells 120 by applying a voltage to the multiplexer 166 electrically connecting the global digit line 108A, 108B to the particular conductive pillar structure 160 by means of the global digit line contact structures 162 and the isolated conductive structures 164 between the global digit line 108A, 108B and the multiplexer 166 associated with the particular conductive pillar structure 160. The multiplexers 166 may be driven by a multiplexer driver and/or a multiplexer control logic device operably coupled to the conductive structure 132 to which the multiplexer 166 is coupled (e.g., the conductive structure 132 vertically above (e.g., in the Z-direction) the multiplexer 166).

Each global digit line 108A, 108B may be configured to be selectively coupled to more than one of the conductive pillar structures 160 by means of the multiplexers 166 coupled to each of the conductive pillar structures 160. In some embodiments, each global digit line 108A, 108B is configured to selectively be in electrical communication with four (4) of the conductive pillar structures 160, each one of which is associated with a different vertical stack structure 135. In other embodiments, each of the global digit lines 108A, 108B is configured to selectively be in electrical communication with eight (8) of the conductive pillar structures 160 or sixteen (16) of the conductive pillar structures 160. One of the multiplexers 166 may be located between (e.g., horizontally between) a conductive pillar structure 160 and a horizontally neighboring isolated conductive structure 164 that is, in turn, in electrical communication with a global digit line 108A, 108B by means of a global digit line contact structures 162. Accordingly, in some embodiments, the multiplexers 166 are individually configured to receive a signal (e.g., a select signal) from a multiplexer controller region and provide the signal to a bit line (e.g., conductive pillar structures 160 (FIG. 1L)) to selectively access desired memory cells within the array region 101 for effectuating one or more control operations of the memory cells 120.

Accordingly, the global digit lines 108A, 108B are configured to be selectively electrically connected to each conductive pillar structure 160 vertically extending (e.g., in the Z-direction) through a vertical stack of memory cells 120 by applying a voltage to the multiplexer 166 electrically connecting the global digit line 108A, 108B to the particular conductive pillar structure 160 by means of the global digit line contact structure 162 and the isolated conductive structures 164 between the global digit line 108A, 108B and the multiplexer 166 associated with the particular conductive pillar structure.

In some embodiments, access devices 130 vertically (e.g., in the Z-direction) neighboring (e.g., vertically above) the multiplexers 166 may individually comprise a transistor 170, one of which is illustrated in box 171, configured to electrically couple a horizontally neighboring (e.g., in the X-direction) conductive pillar structure 160 to the conductive plate structure 142 through the additional conductive structures 172. The transistor 170 may comprise a so-called "bleeder" transistor or a "leaker" transistor configured to provide a bias voltage to the conductive pillar structures 160 to which it is coupled (e.g., the horizontally neighboring (e.g., in the X-direction) conductive pillar structures 160). In some embodiments, the conductive structure 132 coupled to the transistors 170 may be in electrical communication with a voltage, such as a drain voltage $V_{dd}$ or a voltage source supply $V_{ss}$. In use and operation, the transistors 170 are configured to provide a negative voltage to the conductive pillar structures 160 of unselected (e.g., inactive) vertical stacks of memory cells 120. In other words, the transistors 170 are configured to electrically connect unselected conductive pillar structures 160 with their respective conductive plate structures 142 (e.g., ground structures, cell plates), which may be coupled to a negative voltage. In some embodiments, each vertical stack of memory cells 120 includes at least one (e.g., one) of the multiplexers 166 and at least one (e.g., one) of the transistors 170.

In some embodiments, each of the additional conductive structures 172 is individually in electrical communication with one transistor 170 configured to be in electrical communication with a conductive pillar structure 160 vertically extending proximate a first vertical stack of access devices 130 of a first vertical stack of memory cells 120 and is further in electrical communication with a second transistor 170 configured to be in electrical communication with an additional conductive pillar structure 160 vertically extending proximate a second stack of access devices 130 of a second vertical stack of memory cells 120.

In some embodiments, a horizontal dimension (e.g., in the X-direction) of the conductive structures 132 of the multiplexers 166 may be the same as or less than a horizontal dimension (e.g., in the X-direction) of the conductive structures 132 of the transistors 170, which may be less than a horizontal dimension (e.g., in the X-direction) of the conductive structures 132 intersecting the memory cells 120.

With reference to FIG. 1K, the first microelectronic device structure 100 includes multiplexer driver regions 167 including multiplexer drivers for driving (e.g., providing a drive voltage) to the multiplexers 166 and bleeder driver regions 173 including drivers for driving (e.g., providing a drive voltage) to the transistors 170. In some embodiments, the multiplexer driver regions 167 are located on a first horizontal end (e.g., in the X-direction) of the first microelectronic device structure 100 and the bleeder driver regions 173 are located on a second, opposite horizontal end (e.g., in the X-direction) of the first microelectronic device structure 100 opposite the multiplexer driver regions 167. In some embodiments, each vertical stack structure 135 includes a multiplexer driver region 167 located within horizontal boundaries (e.g., in the X-direction, in the Y-direction) of one of the staircase structures 174 thereof and a bleeder driver region 173 located within horizontal boundaries (e.g., in the X-direction, in the Y-direction) of the other of the staircase structures 174 thereof (e.g., opposite the multiplexer driver region 167).

In some embodiments, the conductive structures 132 in electrical communication with the multiplexers 166 are in electrical communication with the multiplexer driver region 167 vertically neighboring (e.g., in the Z-direction) the vertical stack structure 135 including the conductive structures 132. In some embodiments, the conductive structures 132 may be located within horizontal boundaries of the multiplexer driver region 167 with which it is in electrical communication in at least a first horizontal direction (e.g., in the Y-direction). In some embodiments, the multiplexers 166 are individually configured to receive a signal (e.g., a select signal) from the associated multiplexer driver region 167 and provide the signal to a bit line (e.g., conductive pillar structures 160 (FIG. 1B)) to selectively access desired memory cells 120 within the array region 101 for effectuating one or more control operations of the memory cells 120.

In addition, the conductive structures 132 in electrical communication with the transistors 170 are in electrical communication with the bleeder driver region 173 vertically neighboring (e.g., in the Z-direction) the vertical stack structure 135 including the conductive structures 132. In some embodiments, the conductive structures 132 may be located within horizontal boundaries of the bleeder driver region 173 with which it is in electrical communication in at least a first horizontal direction (e.g., in the Y-direction). In some embodiments, the transistors 170 are individually configured to receive a signal (e.g., a drive signal) from the associated bleeder driver region 173 electrically connect the conductive plate structure 142 to the conductive pillar structure 160.

With reference to FIG. 1M, in some embodiments, the conductive structure 132 in electrical communication with the multiplexers 166 (e.g., the vertically uppermost (e.g., in the Z-direction) conductive structure 132) is in electrical communication with a pad structure 178 that is, in turn, in electrical communication with the multiplexer driver region 167. In addition, the conductive structure 132 in electrical communication with the transistors 170 (e.g., the second vertically uppermost conductive structure 132) is in electrical communication with a pad structure 178 that is, in turn, in electrical communication with the bleeder driver region 173. In some embodiments, each of the multiplexer driver regions 167 and the bleeder driver region 173 individually vertically underlie the staircase structures 174. In some embodiments, the multiplexer driver regions 167 and the bleeder driver region 173 are individually located within the first base structure 112. By way of non-limiting example, each of the multiplexer driver regions 167 and the bleeder driver region 173 individually includes transistors that are in electrical communication with the pad structures 178 (FIG. 1M) electrically connected to the vertically uppermost conductive structure 132 and the second vertically uppermost conductive structure 132, respectively.

With reference to FIG. 1L and FIG. 1M, after forming the global digit lines 108A, 108B, a fourth insulative material 182 may be formed vertically over (e.g., in the Z-direction) the third insulative material 180. Each of the third insulative material 180 and the fourth insulative material 182 may individually be formed of and include insulative material, such as one or more of the materials described above with reference to the first insulative material 114. In some embodiments, the fourth insulative material 182 comprises an oxide material. In some embodiments, the third insulative material 180 and the fourth insulative material 182 are individually formed of and include silicon dioxide.

Referring to FIG. 1K, portions of the first microelectronic device structure 100 (e.g., the fourth insulative material 182, the third insulative material 180, the mask material 116, the second insulative material 119) are not illustrated to more clearly illustrate the relative positions of other structures (e.g., the vertical stacks of memory cells 120 including the vertical stacks of access devices 130 and the vertical stacks of storage devices 150, the vertical stack structures 135, the conductive pillar structures 160, the global digit lines 108A, 108B) of the first microelectronic device structure 100.

Although FIG. 1K illustrates seventy-two (72) vertical stacks of memory cells 120 (e.g., eight (8) rows and nine (9) columns of vertical stacks of memory cells 120), the disclosure is not so limited, and the array region 101 may include greater than seventy two vertical stacks of memory cells 120.

Although FIG. 1K illustrates that the vertical stack structures 135 individually intersect and form portions of nine (9) of the vertical stacks of memory cells 120, the disclosure is not so limited. In other embodiments, conductive structures 132 of the vertical stack structure 135 individually intersect and form portions of fewer than nine (9) of the vertical stacks of memory cells 120, such as fewer than or equal to eight (8) of the vertical stacks of the memory cells 120, fewer than or equal to six (6) of the vertical stacks of the memory cells 120, or fewer than or equal to four (4) of the vertical stacks of the memory cells 120. In other embodiments, the conductive structures 132 of the vertical stack structure 135 individually intersect and form portions of more than nine (9) of the vertical stacks of the memory cells 120, such as more than or equal to ten (10) of the vertical stacks of the memory cells 120, more than or equal to twelve (12) of the vertical stacks of the memory cells 120, more than or equal to sixteen (16) of the vertical stacks of the memory cells 120, or more than or equal to twenty (20) of the vertical stacks of the memory cells 120.

With continued reference to FIG. 1K, in some embodiments, the conductive pillar structures 160 in horizontally neighboring (e.g., in the Y-direction) vertical stack structures 135 are horizontally aligned (e.g., in the X-direction) with each other. In other embodiments, conductive pillar structures 160 in horizontally neighboring (e.g., in the Y-direction) vertical stack structures 135 are horizontally aligned (e.g., in the X-direction) with each other.

Accordingly, and with reference again to FIG. 1L, a vertical stack of memory cells 120 is illustrated in box 190. Each vertical stack of memory cells 120 individually includes one of the vertical stacks of storage devices 150 horizontally neighboring one of the vertical stacks of access devices 130; a conductive pillar structure 160 vertically extending (e.g., in the Z-direction) through or neighboring the vertical stack of access devices 130; the conductive plate structure 142; one of the isolated conductive structures 164 and the associated multiplexer 166; and one of the additional conductive structures 172 and one of the associated transistors 170. In some embodiments, each additional conductive structure 172 and conductive plate structure 142 is shared between horizontally neighboring (e.g., in the Y-direction) vertical stacks of memory cells 120. In some embodiments, each memory cell 120 comprises a dynamic random access memory (DRAM) cell.

In some embodiments, such as where each conductive pillar structure 160 is in electrical communication with a horizontally neighboring (e.g., in the Y-direction) conductive pillar structure 160, the vertical stack of memory cells 120 may effectively include the horizontally neighboring vertical stack of storage devices 150 and access devices 130 since the conductive pillar structures 160 are shared.

Figure 2A:
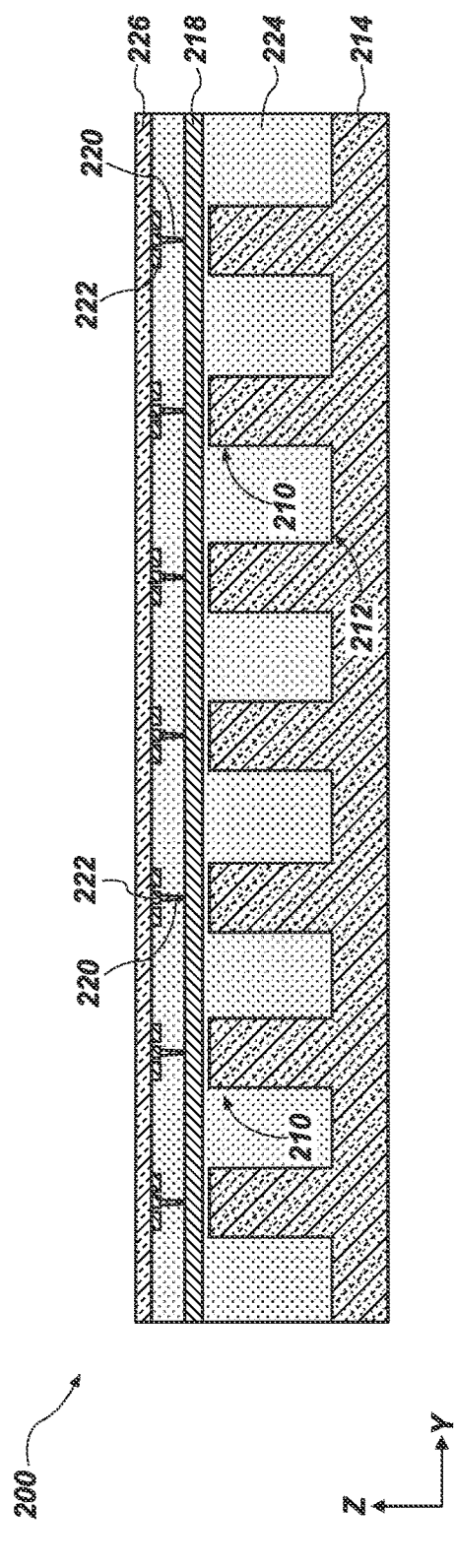
FIG. 2A through FIG. 2D include a simplified partial cross-sectional views illustrating a second microelectronic device structure and a method of attaching a carrier wafer assembly to the second microelectronic device structure, in accordance with embodiments of the disclosure.
Figure 2B:
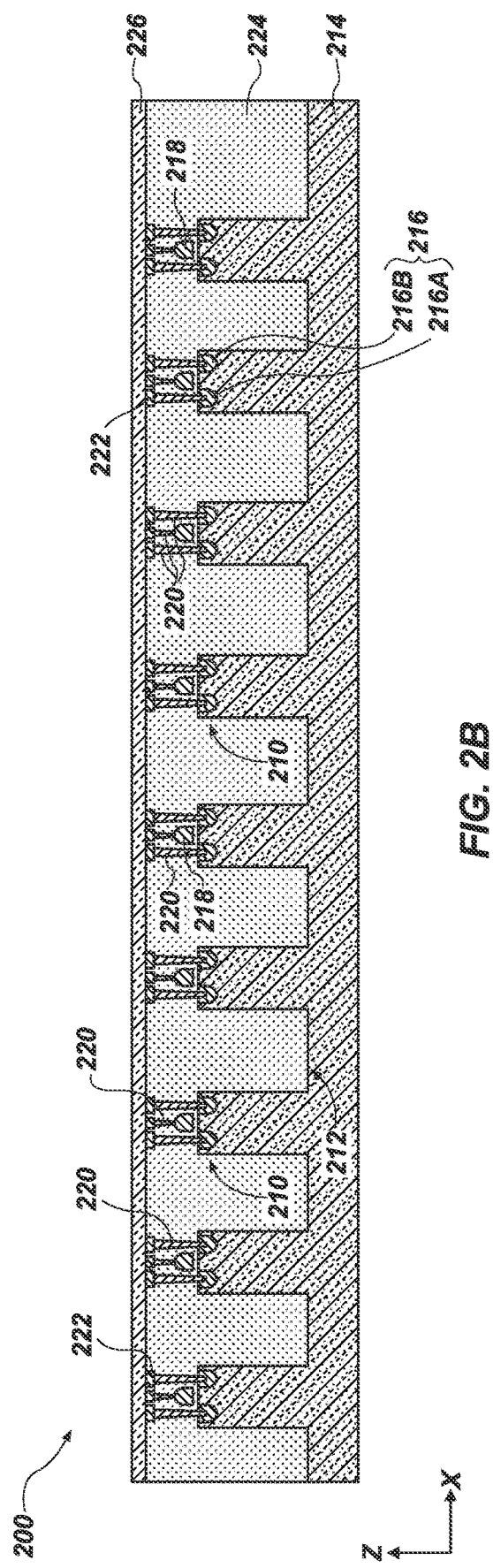

FIG. 2A is a simplified partial cross-sectional view of a second microelectronic device structure 200 illustrated a first cross-section of the second microelectronic device structure 200 and FIG. 2B is a simplified partial cross-sectional view of a second microelectronic device structure 200 illustrated a second cross-section of the second microelectronic device structure 200, in accordance with embodiments of the disclosure. As described in further detail herein, the second microelectronic device structure 200 may be attached to the first microelectronic device structure 100 to form a microelectronic device (e.g., microelectronic device 300 (FIG. 3A, FIG. 3B)).

The second microelectronic device structure 200 may include one or more control logic devices (e.g., CMOS devices) and circuitry. By way of non-limiting example, the second microelectronic device structure 200 may include one or more sub word line driver regions, one or more socket regions, and one or more additional CMOS regions including one or more of (e.g., all of) one or more sense amplifier devices (e.g., equalization (EQ) amplifiers, isolation (ISO) amplifiers, NMOS sense amplifiers (NSAs), PMOS sense amplifiers (PSAs)), column decoders, multiplexer control logic devices, sense amplifier drivers, main word line driver devices, row decoder devices, and row select devices.

With collective reference to FIG. 2A and FIG. 2B, the second microelectronic device structure 200 includes transistor structure 210 for forming the control logic devices (e.g., sub word line drivers, sense amplifiers devices, column decoders, multiplexer control logic, sense amplifier drivers, main word line drivers, row decoders, row select devices) of the second microelectronic device structure 200.

The transistor structures 210 may be separated from one another by isolation trenches 212 within a second base structure 214 (e.g., a second semiconductive wafer). The isolation trenches 212 may comprise a fifth insulative material 224. The second base structure 214 may include a base material or construction upon which additional materials and structures of the second microelectronic device structure 200 are formed. The second base structure 214 may comprise a semiconductive structure (e.g., a semiconductive wafer), or a base semiconductive material on a supporting structure. For example, the second base structure 214 may comprise a conventional silicon substrate (e.g., a conventional silicon wafer), or another bulk substrate comprising a semiconductive material. In some embodiments, the second base structure 214 comprises a silicon wafer. In addition, the second base structure 214 may include one or more layers, structures, and/or regions formed therein and/or thereon.

The transistor structures 210 may each include conductively doped regions 216, each of which includes a source region 216A and a drain region 216B. Channel regions of the transistor structures 210 may be horizontally interposed between the conductively doped regions 216. Channel regions of the transistor structures 210 may be horizontally interposed between the conductively doped regions 216. In some embodiments, the conductively doped regions 216 of each transistor structure 210 individually comprises one or more semiconductive materials doped with at least one conductivity enhancing chemical species, such as at least one N-type dopant (e.g., one or more of arsenic, phosphorous, antimony, and bismuth) or at least one P-type dopant (e.g., one or more of boron, aluminum, and gallium). In some embodiments, the conductively doped regions 216 comprise conductively doped silicon.

The transistor structures 210 include gate structures 218 vertically overlying the second base structure 214 and horizontally extending between conductively doped regions 216. The gate structures 218 may be horizontally aligned (e.g., in the Y-direction) with and shared by the channel regions of multiple transistor structures 210 horizontally neighboring (e.g., in the X-direction (FIG. 2B)) one another. In some such embodiments, the gate structures 218 extend in a first horizontal direction (e.g., in the Y-direction). In addition, dielectric material (also referred to herein as a "gate dielectric material") may be vertically interposed between the gate structures 218 and portions of the second base structure 214 at least partially defining the channel regions of the transistor structures 210. The conductively doped regions 216 and the gate structures 218 may individually be electrically coupled to second conductive interconnect structures 220. The second conductive interconnect structures 220 may individually electrically couple the conductively doped regions 216 and the gate structures 218 to one or more first routing structures 222. In FIG. 2A, the conductively doped regions 216 and the second conductive interconnect structures 220 in electrical communication with the conductively doped regions 216 are not illustrated, but it will be understood, that the conductively doped regions 216 and the second conductive interconnect structures 220 are located in a plane different than that in which the gate structures 218 extend. By way of non-limiting example, each gate structure 218 may be in electrical communication with a plurality of source regions 216A on a first side of the gate structure 218 (e.g., spaced from the gate structure 218 in the X-direction) and a plurality of drain regions 216B on a second, opposite side of the gate structure 218 (e.g., spaced from the gate structure 218 in the X-direction opposite the source regions 216A). At least some of the first routing structures 222 (e.g., the first routing structures 222 not in electrical communication with the second conductive interconnect structures 220 in electrical communication with the gate structure 218) may be in electrical communication with second conductive interconnect structures 220 that are, in turn, in electrical communication with one of the source regions 216A or one of the drain regions 216B.

Each of the gate structures 218, the second conductive interconnect structure 220, and the first routing structures 222 may individually be formed of and include conductive material. In some embodiments, the gate structures 218, the second conductive interconnect structure 220, and the first routing structures 222 are individually formed of and include tungsten. In other embodiments, the gate structures 218, the second conductive interconnect structure 220, and the first routing structures 222 are individually formed of and include copper.

The second microelectronic device structure 200 may include the fifth insulative material 224 between the transistor structures 210 and electrically isolating different portions of the transistor structures 210, the second conductive interconnect structures 220, and the first routing structures 222.

The fifth insulative material 224 may be formed of and include one or more of the materials described above with reference to the first insulative material 114 (FIG. 1L, FIG. 1M). In some embodiments, the fifth insulative material 224 comprises substantially the same material composition as the first insulative material 114. In some embodiments, the fifth insulative material 224 comprises silicon dioxide.

A sixth insulative material 226 vertically overlies the fifth insulative material 224 and the first routing structures 222. The sixth insulative material 226 may be formed of and include one or more of the materials described above with reference to the fifth insulative material 224. In some embodiments, the sixth insulative material 226 comprises substantially the same material composition as the fifth insulative material 224. In some embodiments, the sixth insulative material 226 comprises a different material composition than the fifth insulative material 224. In some embodiments, the sixth insulative material 226 comprises silicon dioxide.

Figure 2C:
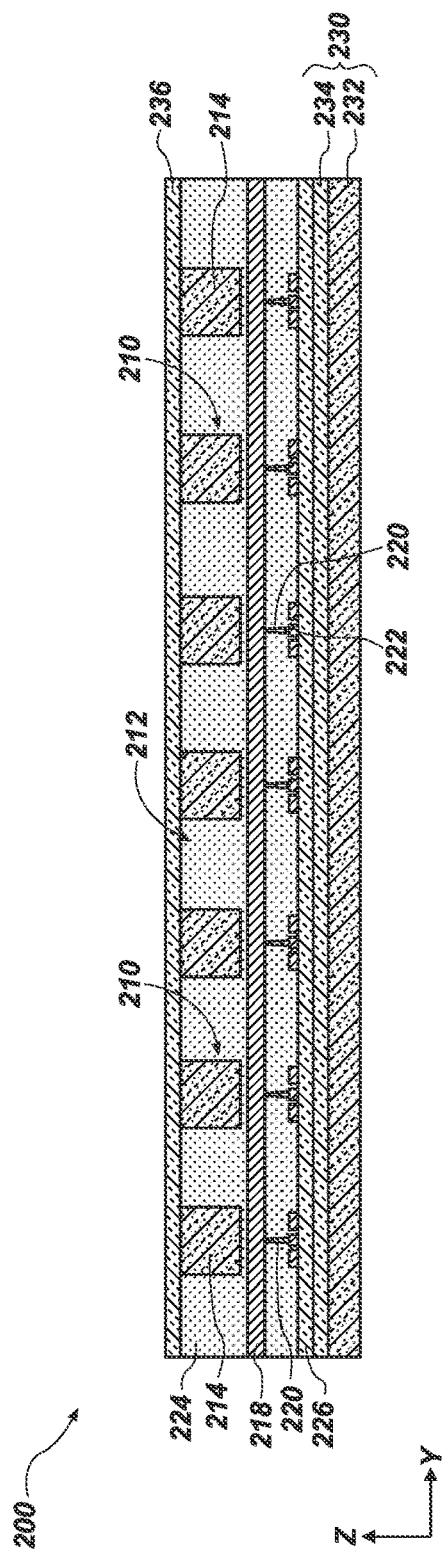
Figure 2D:
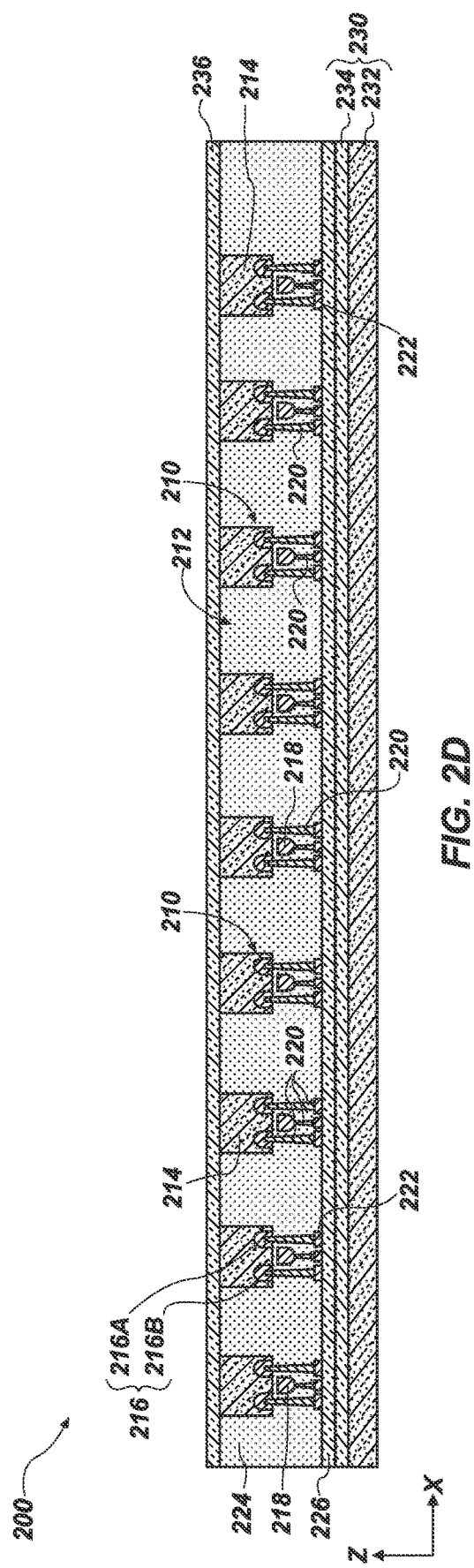

Referring now to FIG. 2C and FIG. 2D, a carrier wafer assembly 230 may be bonded to the second microelectronic device structure 200 and the second microelectronic device structure 200 may be vertically (e.g., in the Z-direction) inverted (e.g., flipped). FIG. 2C illustrates the same cross-sectional view of the second microelectronic device structure 200 illustrated in FIG. 2A; and FIG. 2D illustrates the same cross-sectional view of the second microelectronic device structure 200 illustrated in FIG. 2B.

The carrier wafer assembly 230 may include a wafer structure 232 and a seventh insulative material 234 over the wafer structure 232. The wafer structure 232 may comprise, for example, a glass substrate. The seventh insulative material 234 may comprise an oxide material, such as, for example, silicon dioxide. In some embodiments, the seventh insulative material 234 comprises substantially the same material composition as the sixth insulative material 226.

The carrier wafer assembly 230 may be attached to the second microelectronic device structure 200 by placing the seventh insulative material 234 in contact with the sixth insulative material 226 and exposing the second microelectronic device structure 200 and the carrier wafer assembly 230 to annealing conditions to form bonds (e.g., oxide-to-oxide bonds) between the seventh insulative material 234 in contact with the sixth insulative material 226. In some embodiments, the second microelectronic device structure 200 and the carrier wafer assembly 230 are exposed to a temperature greater than, for example, 800° C., to form the oxide-to-oxide bonds and attach the second microelectronic device structure 200 to the carrier wafer assembly 230.

After attaching the carrier wafer assembly 230 to the second microelectronic device structure 200, the second microelectronic device structure 200 may be vertically (e.g., in the Z-direction) inverted (e.g., flipped) and the second base structure 214 may be vertically (e.g., in the Z-direction) thinned by exposing the second base structure 214 to a chemical mechanical planarization (CMP) process. In other embodiments, the second base structure 214 is vertically thinned by exposing the second base structure 214 to a dry etch. Vertically thinning the second base structure 214 may electrically isolate the transistor structures 210 from one another.

After vertically thinning the second base structure 214, an eighth insulative material 236 is formed over the second microelectronic device structure 200. The eighth insulative material 236 may be formed of and include one or more of the materials described above with reference to the fifth insulative material 224. In some embodiments, the eighth insulative material 236 comprises silicon dioxide.

Figure 3A:
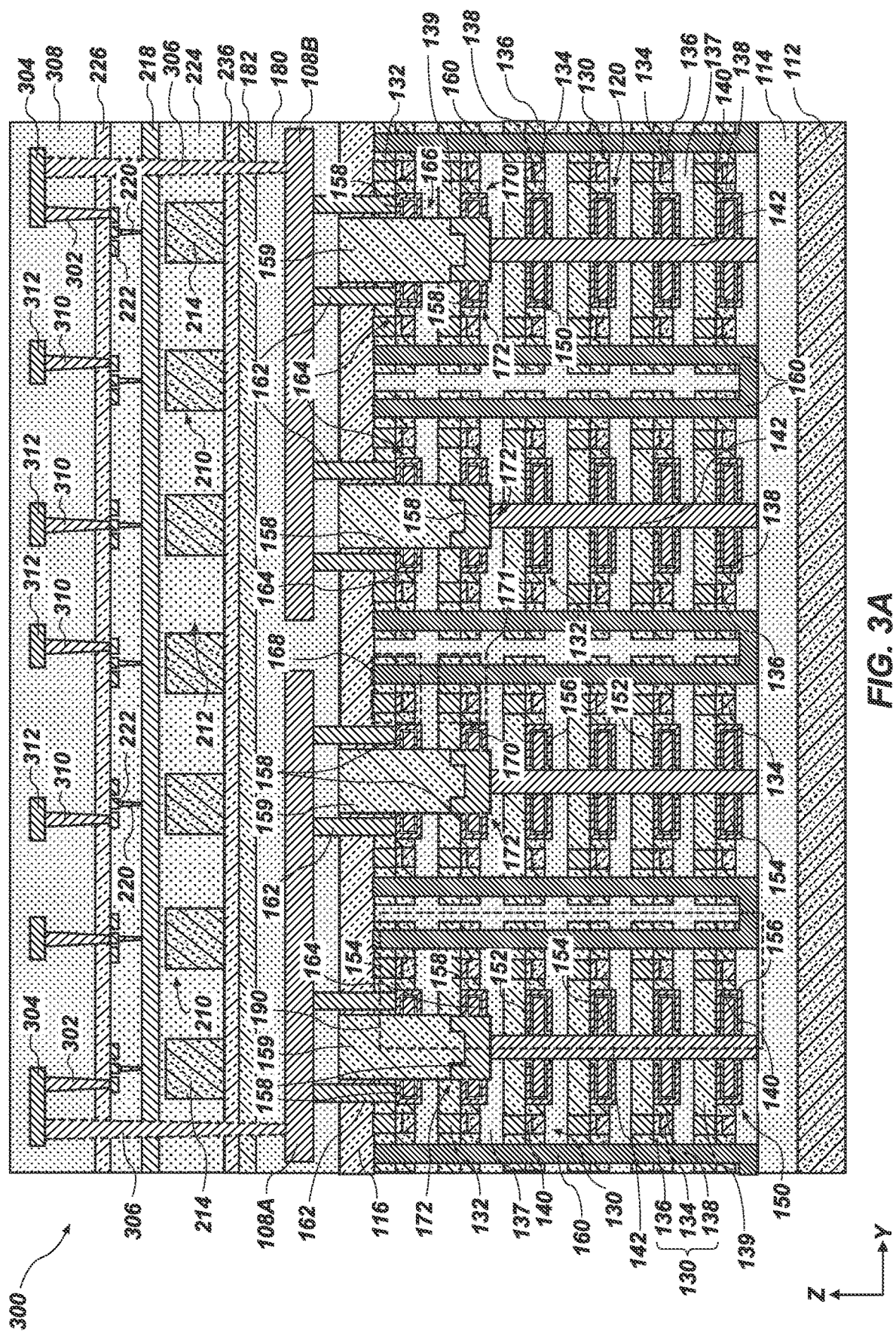
FIG. 3A and FIG. 3B are simplified partial cross-sectional views illustrating a microelectronic device after attachment of the second microelectronic device structure to the first microelectronic device structure, in accordance with embodiments of the disclosure.
Figure 3B:
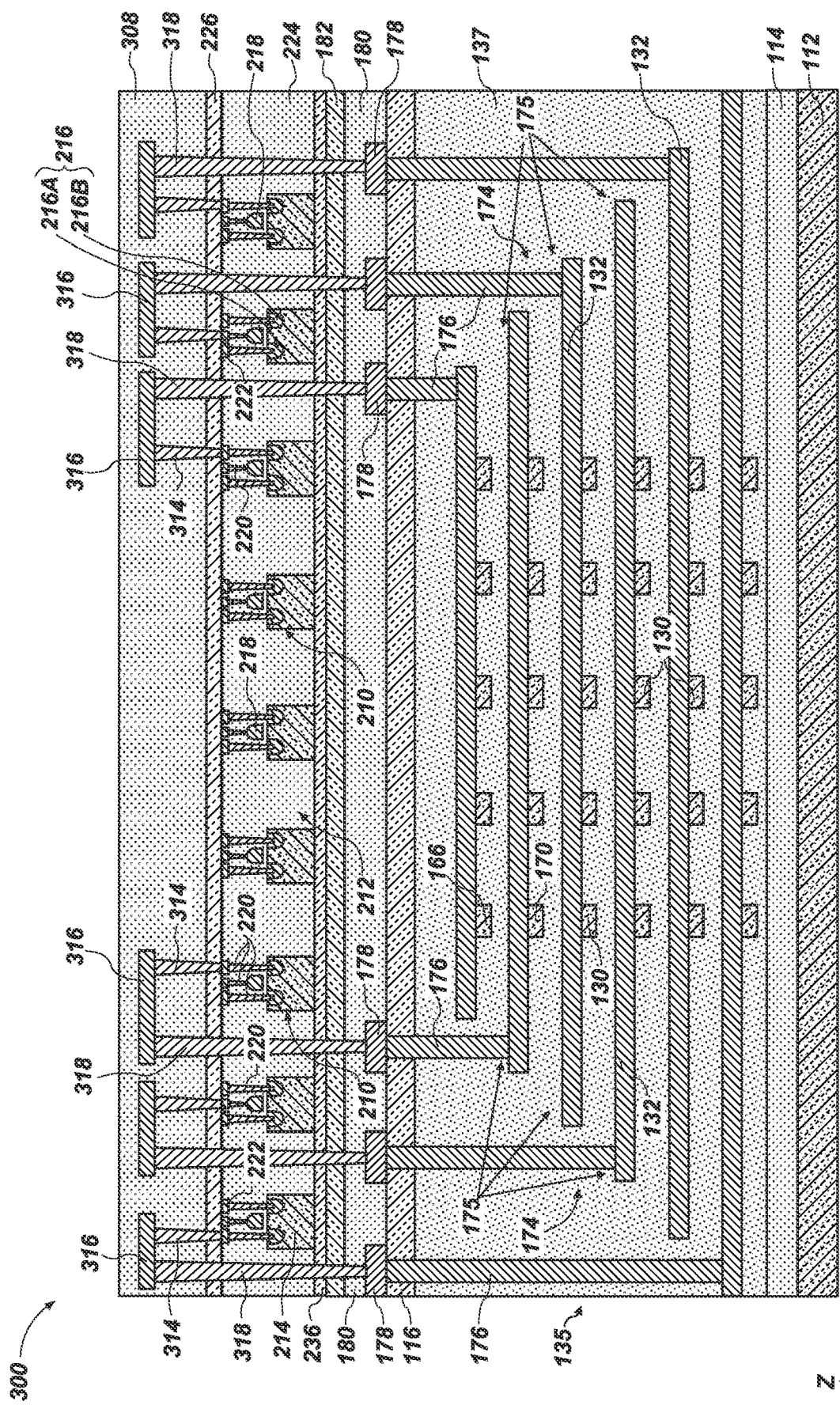

With reference to FIG. 3A and FIG. 3B, the second microelectronic device structure 200 may be vertically (e.g., in the Z-direction) inverted (e.g., flipped) and attached to the first microelectronic device structure 100 to form a microelectronic device 300 comprising the first microelectronic device structure 100 and the second microelectronic device structure 200 attached to the first microelectronic device structure 100. FIG. 3A illustrates the same cross-sectional view of the first microelectronic device structure 100 and the second microelectronic device structure 200 illustrated in FIG. 1L and FIG. 2C, respectively; and FIG. 3B illustrates the same cross-sectional view of the first microelectronic device structure 100 and the second microelectronic device structure 200 illustrated in FIG. 1M and FIG. 2D, respectively.

In some embodiments, attaching the second microelectronic device structure 200 to the first microelectronic device structure 100 includes horizontally aligning (e.g., in the X-direction, in the Y-direction) transistor structures 210 of the second microelectronic device structure 200 with the array region 101, such as with the vertical stacks of memory cells 120. In some embodiments, the transistor structures 210 vertically overlying (e.g., in the Z-direction) the global digit lines 108A, 108B and the vertical stacks of memory cells 120 and within horizontal boundaries (e.g., in the X-direction, in the Y-direction) of the array region 101 including the vertical stacks of memory cells 120 comprise sense amplifier devices (e.g., equalization (EQ) amplifiers, isolation (ISO) amplifiers, NMOS sense amplifiers (NSAs), PMOS sense amplifiers (PSAs)). In some such embodiments, the second microelectronic device structure 200 includes a sense amplifier region located within horizontal boundaries of the array region 101.

In some embodiments, at least some of the transistor structures 210 vertically overlying and located within horizontal boundaries (e.g., in the X-direction, in the Y-direction) of the array region 101 comprise sense amplifier drivers (e.g., NMOS sense amplifier drivers (RNL) and PMOS sense amplifier drivers (ACT)). The NMOS sense amplifier drivers may generate, for example, activation signals for driving the NMOS sense amplifiers and the PMOS sense amplifier drivers may generate, for example, activation signals for driving the PMOS sense amplifiers.

Attaching the second microelectronic device structure 200 to the first microelectronic device structure 100 includes horizontally aligning (e.g., in the X-direction, in the Y-direction) at least additional transistor structures 210 with the staircase structures 174 of the first microelectronic device structure 100. In some embodiments, the additional transistor structures 210 vertically overlying (e.g., in the Z-direction) the staircase structures 174 and the steps 175 and within horizontal boundaries (e.g., in the X-direction, in the Y-direction) of the staircase structures 174 may comprise sub word line drivers. In some embodiments, at least some of the transistor structures 210 forming a portion of the sub word line drivers may be in electrical communication with the conductive structures 132 of the array region 101 of the first microelectronic device structure 100.

With reference to FIG. 3B, in some embodiments, at least some of the transistor structures 210 are located outside horizontal boundaries (e.g., in the X-direction) of the staircase structures 174. Such transistor structures 210 may comprise a portion of one or more additional control logic devices configured for effectuating control operations of, for example, memory cells 120 of the vertical stacks of memory cells 120. By way of non-limiting example, the additional control logic devices may include one or more of one or more column decoder regions, one or more input/output device regions, one or more main word line driver regions, one or more row decoder devices, one or more row select devices, and one or more multiplexer control logic devices.

In some embodiments, at least some of the transistor structures 210 may form additional complementary metal-oxide-semiconductor (CMOS) devices such as one or more (e.g., each) of charge pumps (e.g., $V_{CCP}$ charge pumps, $V_{NEGWL}$ charge pumps, DVC2 charge pumps), decoupling capacitors, voltage generators, power supply terminals, drain supply voltage ($V_{DD}$) regulators, decoders (e.g., local deck decoders), repair circuitry (e.g., column repair circuitry, row repair circuitry), memory test devices, array multiplexers (MUX) (e.g., in addition to multiplexers 166), error checking and correction (ECC) devices, self-refresh/wear leveling devices, page buffers, data paths, I/O devices (e.g., local I/O devices), controller logic (timing circuitry, clock devices (e.g., a global clock device)), deck enable, read/write circuitry, address circuitry, or other logic devices and circuitry, and various chip/deck control circuitry.

With reference to FIG. 3A, in some embodiments, third conductive interconnect structures 302 may be formed in electrical communication with at least some of the first routing structures 222 of the transistor structures 210 vertically overlying (e.g., in the Z-direction) the vertical stacks of memory cells 120 of the array region 101 and the global digit lines 108A, 108B.

The third conductive interconnect structures 302, may in turn, be in electrical communication with second routing structures 304 horizontally extending (e.g., in the Y-direction) from the third conductive interconnect structures 302 to fourth conductive interconnect structures 306. The fourth conductive interconnect structures 306 are formed in electrical communication with the global digit lines 108A, 108B vertically underlying (e.g., in the Z-direction) the second microelectronic device structure 200. The fourth conductive interconnect structures 306 may vertically extend through a ninth insulative material 308, the sixth insulative material 226, the fifth insulative material 224, the eighth insulative material 236, the fourth insulative material 182, and the third insulative material 180. In some embodiments, the fourth conductive interconnect structures 306 are located in a different plane than the gate structures 218 such that the fourth conductive interconnect structures 306 do not electrically short to the gate structures 218 and are, therefore, illustrated in broken lines in the view of FIG. 3A.

Accordingly, in some embodiments, the sense amplifier devices of the sense amplifier device region of the second microelectronic device structure 200 are in electrical communication with the global digit lines 108A, 108B of the first microelectronic device structure by means of the third conductive interconnect structures 302, the second routing structures 304, and the fourth conductive interconnect structures 306. In some embodiments, each sense amplifier device is in electrical communication with one of the first global digit lines 108A and one of the second global digit lines 108B. In use and operation (e.g., such as during a read operation of the memory cells 120), the sense amplifier devices are configured to amplify a signal (e.g., a difference in voltage) between the first global digit line 108A and the second global digit line 108B to which the sense amplifier device is connected.

In some embodiments, at least some of the transistor structures 210 vertically overlying (e.g., in the Z-direction) and within horizontal boundaries (e.g., in the X-direction, in the Y-direction) of the array region 101 including the vertical stacks of memory cells 120 are in electrical communication with fifth conductive interconnect structures 310 that are, in turn, in electrical communication with third routing structure 312. The fifth conductive interconnect structures 310 and the third routing structures 312 may be in electrical communication with transistor structures 210 comprising one or more control logic devices configured for effectuating control operations of the vertical stacks of memory cells 120, such as, for example, one or more of column decoders, column select devices, row decoders, sense amplifier drivers, and one or more additional CMOS devices.

Referring now to FIG. 3B, sixth conductive interconnect structures 314 may be in electrical communication with the first routing structures 222 of the transistor structures 210 vertically overlying (e.g., in the Z-direction) and within horizontal boundaries (e.g., in the X-direction, in the Y-direction) of the staircase structures 174 of the first microelectronic device structure 100. The sixth conductive interconnect structures 314 may be in electrical communication with fourth routing structures 316. The fourth routing structures 316 are, in turn, in electrical communication with seventh conductive interconnect structures 318. The seventh conductive interconnect structures 318 are in electrical communication with the pad structures 178 in electrical communication with the conductive structures 132 of the first microelectronic device structure.

In some embodiments, the transistor structures 210 vertically overlying (e.g., in the Z-direction) and within horizontal boundaries (e.g., in the X-direction, in the Y-direction) of the staircase structures 174 form at least a portion of sub word line drivers. In some embodiments, at least some of the transistor structures 210 comprise multiplexer controller circuitry. By way of non-limiting example, at least some of the transistor structures 210 in electrical communication with the vertically uppermost (e.g., in the Z-direction) conductive structure 132 may comprise at least a portion of multiplexer controller circuitry.

In some embodiments, at least some of the transistor structures 210 vertically overlying (e.g., in the Z-direction) and within horizontal boundaries (e.g., in the X-direction, in the Y-direction) of the vertical stack structures 135 (e.g., within horizontal boundaries of the vertical stack structures 135 and outside the horizontal boundaries (e.g., in the X-direction) of the staircase structures 174) may comprise one or more control logic devices configured for effectuating control operations for the vertical stacks of memory cells 120, such as, for example, one or more of row decoders and main word line drivers.

Each of the third conductive interconnect structures 302, the second routing structures 304, the fourth conductive interconnect structures 306, the fifth conductive interconnect structures 310, the third routing structures 312, the sixth conductive interconnect structures 314, the fourth routing structures 316, the seventh conductive interconnect structures 318 may individually be formed of and include conductive material. In some embodiments, each of the third conductive interconnect structures 302, the second routing structures 304, the fourth conductive interconnect structures 306, the fifth conductive interconnect structures 310, the third routing structures 312, the sixth conductive interconnect structures 314, the fourth routing structures 316, the seventh conductive interconnect structures 318 individually comprises tungsten. In other embodiments, each of the third conductive interconnect structures 302, the second routing structures 304, the fourth conductive interconnect structures 306, the fifth conductive interconnect structures 310, the third routing structures 312, the sixth conductive interconnect structures 314, the fourth routing structures 316, the seventh conductive interconnect structures 318 individually comprise copper.

Each of the third conductive interconnect structures 302, the second routing structures 304, the fourth conductive interconnect structures 306, the fifth conductive interconnect structures 310, the third routing structures 312, the sixth conductive interconnect structures 314, the fourth routing structures 316, the seventh conductive interconnect structures 318 may be formed in the ninth insulative material 308. The ninth insulative material 308 may be formed of and include insulative material, such as one or more of the materials described above with reference to the first insulative material 114. In some embodiments, the ninth insulative material 308 comprises silicon dioxide.

In some embodiments, after attaching the second microelectronic device structure 200 to the first microelectronic device structure 100 and electrically connecting one or more components of the second microelectronic device structure 200 to one or more components of the first microelectronic device structure 100 (e.g., connecting the transistor structures 210 over the staircase structures 174 to the pad structures 178 (e.g., by means of the seventh conductive interconnect structures 318), connecting at least some of the transistor structures 210 vertically overlying (e.g., in the Z-direction) and within horizontal boundaries (e.g., in the X-direction, in the Y-direction) of the vertical stacks of memory cells 120 to the global digit lines 108A, 108B (e.g., by means of the fourth conductive interconnect structures 306)), a back end of line (BEOL) structure may be formed vertically over (e.g., in the Z-direction) the second microelectronic device structure 200 to complete formation of the microelectronic device 300. The BEOL structure may be formed by conventional methods and is not described in detail herein.

Forming the microelectronic device 300 to include the first microelectronic device structure 100 including the vertical stack of memory cells 120; the transistors 170 within the vertical stack of memory cells 120 and vertically overlying (e.g., in the Z-direction) the memory cells 120 of the vertical stack and in electrical communication with the conductive plate structure 142; and the multiplexers 166 within the vertical stacks of memory cells 120 and vertically overlying (e.g., in the Z-direction) the memory cells 120 and the transistors 170 of the vertical stack and configured to be in electrical communication with the global digit lines 108A, 108B facilitates forming the microelectronic device structure to include a greater quantity of memory cells 120 (e.g., a density of memory cells 120) within a given horizontal area (e.g., in the X-direction, in the Y-direction) compared to conventional microelectronic devices that do not include the multiplexers 166 and the transistors 170 within a vertical stack of memory cells. In some embodiments, top levels of storage devices 150 (e.g., dummy levels of storage devices 150; dummy levels of memory cells 120 including the storage devices 150) may be utilized to form the additional conductive structures 172 and the isolated conductive structures 164 to form electrical contacts to the respective transistors 170 and the multiplexers 166. In addition, utilizing the conductive structures 132 of the vertical stack structure 135 to electrically connect to the multiplexers 166 and the transistors 170 (via the respective isolated conductive structures 164 and the additional conductive structures 172) (e.g., as gates of the respective multiplexers 166 and the transistors 170) may reduce electrical routing and contact structures for operation of the multiplexers 166 and the transistors 170 and the associated multiplexer drivers and transistor drivers, improving the area efficiency of the microelectronic device 300.

Figure 4:
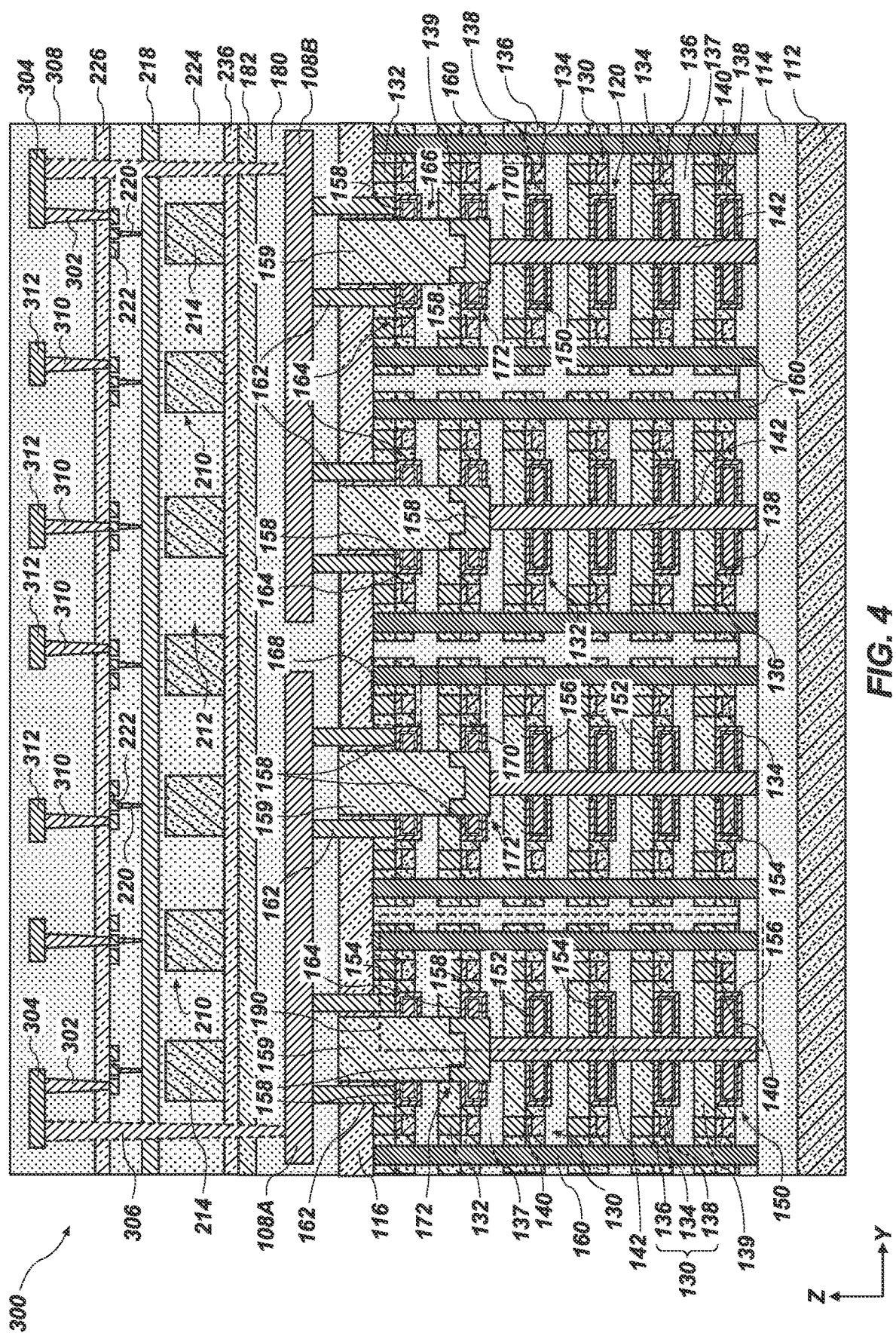
FIG. 4 is a simplified partial cross-sectional view of a microelectronic device, in accordance with embodiments of the disclosure.

Although the first microelectronic device 100 has been described and illustrated as comprising conductive pillar structures 160 of a vertical stack of memory cells 120 electrically connected to an additional conductive pillar structure 160 of a horizontally neighboring (e.g., in the Y-direction) vertical stack of memory cells 120, the disclosure is not so limited. FIG. 4 is a simplified partial cross-sectional view of a microelectronic device 400, in accordance with additional embodiments of the disclosure. The cross-sectional view of FIG. 4 of the microelectronic device 400 illustrates the same cross-sectional view of the microelectronic device 300 illustrated in FIG. 3A.

The microelectronic device 400 may be substantially the same as the microelectronic device 300, except that the conductive pillar structures 160 of first microelectronic device structure 100 are not in electrical communication with other conductive pillar structures 160. In some such embodiments, the each of the vertical stacks of memory cells 120 is electrically isolated from the other vertical stacks of memory cells 120 and do not include shared conductive pillar structures 160, or shared isolated conductive structures 164. In some such embodiments, each vertical stack of memory cells 120 may include one of the isolated conductive structures 164 and associated multiplexer 166 and may share an additional conductive structure 172 with a horizontally neighboring (e.g., in the Y-direction) vertical stack of memory cells 120.

Thus, in accordance with some embodiments, a microelectronic device comprises a vertical stack of memory cells. The vertical stack of memory cells comprises a vertical stack of access devices, a vertical stack of capacitors horizontally neighboring the vertical stack of access devices, a conductive pillar structure in electrical communication with the vertical stack of access devices, and an isolated conductive structure in electrical communication with a multiplexer comprising a vertically uppermost access device of the vertical stack of access devices. The isolated conductive structure comprises a first electrode comprising substantially the same material composition as first electrodes of the vertical stack of capacitors, a second electrode comprising substantially the same material composition as second electrodes of the vertical stack of capacitors, and a conductive material electrically connecting the first electrode to the second electrode. The microelectronic device further comprises a stack structure comprising conductive structures interleaved with insulative structures, at least some of the conductive structures individually in electrical communication with a memory cell of the vertical stack of memory cells and comprising a gate of an access device of the vertical stack of access devices.

Furthermore, in accordance with additional embodiments of the disclosure, a method of forming a microelectronic device comprises forming a vertical stack of memory cells comprising a vertical stack of access devices horizontally neighboring a vertical stack of capacitor structures, forming a conductive plate structure in electrical communication with an electrode of each of the capacitor structures of the vertical stack of capacitor structures, forming a mask material over the vertical stack of memory cells, removing a portion of the conductive plate structure and a portion of vertically uppermost levels of the vertical stack of capacitor structures through an opening in the mask material, partially removing a dielectric material between a first electrode and a second electrode of each of the vertically uppermost levels of the vertical stack of capacitor structures, forming a conductive material within the opening and between the first electrode and the second electrode of each of the vertically uppermost levels of the vertical stack of capacitor structures, and recessing a portion of the conductive material to form isolated conductive structures from a vertically uppermost level of the vertical stack of capacitor structures and an additional conductive structure electrically connecting horizontally neighboring capacitor structures vertically underlying the vertically uppermost level of the vertical stack of capacitor structures.

Moreover, in accordance with some embodiments of the disclosure, a method of forming a microelectronic device comprises forming vertical stacks of memory cells, each individually comprising vertically spaced levels of capacitor structures, vertically spaced levels of access devices horizontally neighboring the vertically spaced levels of capacitor structures, a conductive pillar structure vertically extending through the vertically spaced levels of access devices, and a conductive plate structure in electrical communication with an electrode of the vertically spaced levels of the capacitor structures. The method further comprises removing a portion of the conductive plate structure, removing dielectric material from vertically uppermost two levels of the vertically spaced levels of capacitor structures, forming conductive material in contact with the conductive plate structure and the vertically uppermost two levels of the vertically spaced levels of capacitor structures, and removing a portion of the conductive material to form isolated conductive structures from each capacitor structure within a vertically uppermost level of the capacitor structures, and an additional conductive structure from other of the capacitor structures vertically underlying the vertically uppermost level of the capacitor structures.

Figure 5:
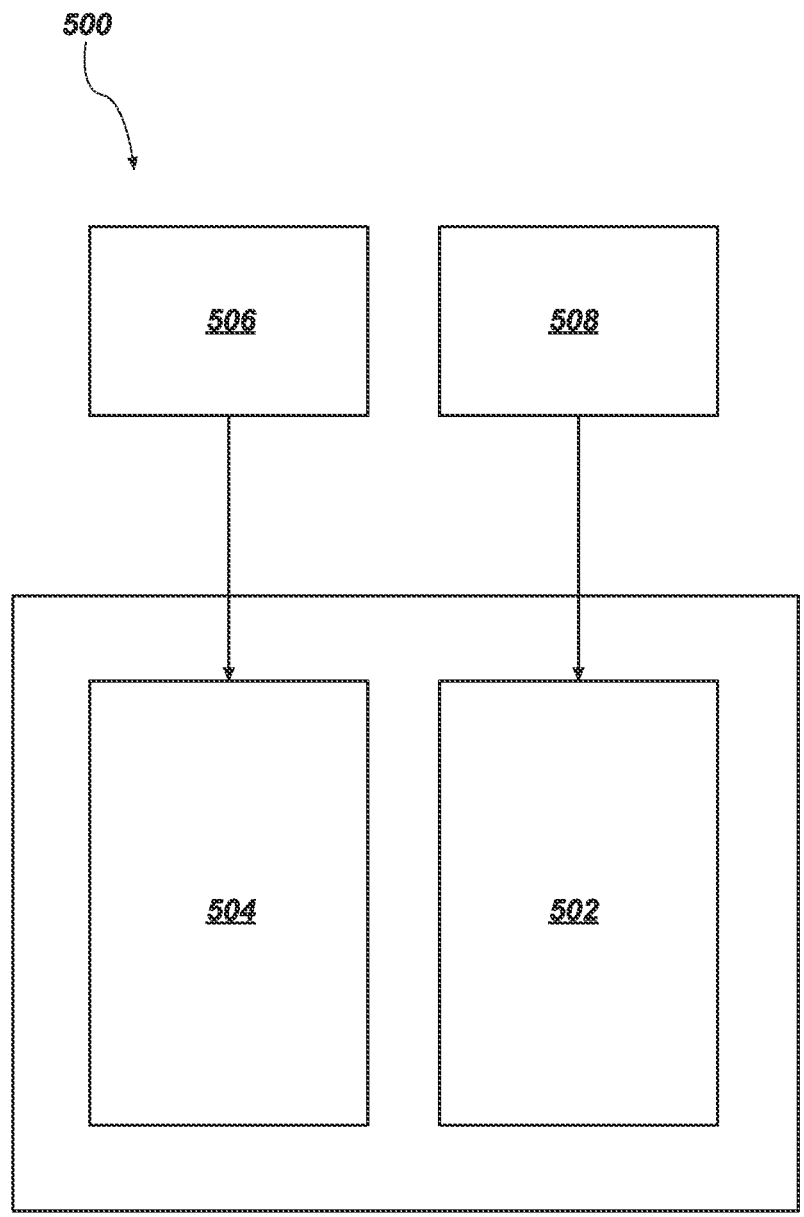
FIG. 5 is a schematic block diagram of an electronic system, in accordance with an embodiment of the disclosure.

Structures, assemblies, and devices in accordance with embodiments of the disclosure may be included in electronic systems of the disclosure. For example, FIG. 5 is a block diagram of an illustrative electronic system 500 according to embodiments of disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 500 includes at least one memory device 502. The memory device 502 may comprise, for example, an embodiment of one or more of a microelectronic device structure, a microelectronic device structure assembly, a relatively larger microelectronic device structure assembly, and a microelectronic device previously described herein with reference to FIG. 1A through FIG. 4. The electronic system 500 may further include at least one electronic signal processor device 504 (often referred to as a "microprocessor"). The electronic signal processor device 504 may, optionally, include an embodiment of one or more of a microelectronic device structure, a microelectronic device structure assembly, a relatively larger microelectronic device structure assembly, and a microelectronic device previously described herein with reference to FIG. 1A through FIG. 4. While the memory device 502 and the electronic signal processor device 504 are depicted as two (2) separate devices in FIG. 5, in additional embodiments, a single (e.g., only one) memory/processor device having the functionalities of the memory device 502 and the electronic signal processor device 504 is included in the electronic system 500. In such embodiments, the memory/processor device may include one or more of a microelectronic device structure, a microelectronic device structure assembly, a relatively larger microelectronic device structure assembly, and a microelectronic device previously described herein with reference to FIG. 1A through FIG. 4. The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, one or more of a monitor, a display, a printer, an audio output jack, and a speaker. In some embodiments, the input device 506 and the output device 508 may comprise a single touchscreen device that can be used both to input information to the electronic system 500 and to output visual information to a user. The input device 506 and the output device 508 may communicate electrically with one or more of the memory device 502 and the electronic signal processor device 504.

Thus, in accordance with embodiments of the disclosure, an electronic system comprises an input device, an output device, a processor device operably coupled to the input device and the output device, and a memory device operably coupled to the processor device. The memory device comprises a vertical stack of capacitor structures horizontally neighboring a vertical stack of access devices, a conductive pillar structure vertically extending through the vertical stack of access devices and configured to be in electrical communication with access devices of the vertical stack of access devices, a conductive plate structure in electrical communication with the vertical stack of capacitor structures, isolated conductive structures in electrical communication with vertically uppermost access devices of the vertical stack of access devices, the isolated conductive structures comprising substantially the same material composition as electrodes of the vertical stack of capacitor structures, a global digit line vertically overlying the isolated conductive structures, and conductive contact structures individually in electrical communication with the global digit line and one of the isolated conductive structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a vertical stack of memory cells comprising:
      a vertical stack of access devices;
      a vertical stack of capacitors horizontally neighboring the vertical stack of access devices;
      a conductive pillar structure in electrical communication with the vertical stack of access devices; and
      an isolated conductive structure in electrical communication with a multiplexer comprising a vertically uppermost access device of the vertical stack of access devices, the isolated conductive structure comprising:
         a first electrode comprising substantially the same material composition as first electrodes of the vertical stack of capacitors;
         a second electrode comprising substantially the same material composition as second electrodes of the vertical stack of capacitors; and
         a conductive material electrically connecting the first electrode to the second electrode; and
   a stack structure comprising conductive structures interleaved with insulative structures, at least some of the conductive structures individually in electrical communication with a memory cell of the vertical stack of memory cells and comprising a gate of an access device of the vertical stack of access devices.

2. The microelectronic device of claim 1, wherein the vertical stack of memory cells further comprises an additional conductive structure vertically underlying the isolated conductive structure, the additional conductive structure configured to selectively be in electrical communication with the conductive pillar structure by way of one of the access devices of the vertical stack of access devices.

3. The microelectronic device of claim 2, wherein the additional conductive structure is configured to selectively be in electrical communication with an additional conductive pillar structure of a horizontally neighboring vertical stack of memory cells.

4. The microelectronic device of claim 3, further comprising an additional access device configured to be in electrical communication with the additional conductive structure to electrically connect the additional conductive structure to the additional conductive pillar structure.

5. The microelectronic device of claim 3, wherein the additional conductive pillar structure is in electrical communication with an additional vertical stack of access devices.

6. The microelectronic device of claim 1, further comprising an additional isolated conductive structure horizontally neighboring the isolated conductive structure and in electrical communication with an additional multiplexer of an additional vertical stack of memory cells horizontally neighboring the vertical stack of memory cells.

7. The microelectronic device of claim 6, further comprising an additional conductive structure vertically underlying and within horizontal boundaries of each of the isolated conductive structure and the additional isolated conductive structure.

8. The microelectronic device of claim 6, wherein the additional isolated conductive structure comprises substantially the same material composition as the first electrodes of the vertical stack of capacitors and the second electrodes of the vertical stack of capacitors.

9. The microelectronic device of claim 1, further comprising at least one global digit line vertically overlying the vertical stack of memory cells.

10. The microelectronic device of claim 9, further comprising a global digit line contact structure electrically connecting the at least one global digit line to the isolated conductive structure.

11. The microelectronic device of claim 10, further comprising an additional global digit line contact structure electrically connecting the at least one global digit line to an additional isolated conductive structure of a horizontally neighboring vertical stack of memory cells.

12. A method of forming a microelectronic device, the method comprising:
   forming a vertical stack of memory cells comprising a vertical stack of access devices horizontally neighboring a vertical stack of capacitor structures;
   forming a conductive plate structure in electrical communication with an electrode of each of the capacitor structures of the vertical stack of capacitor structures;
   forming a mask material over the vertical stack of memory cells;
   removing a portion of the conductive plate structure and a portion of vertically uppermost levels of the vertical stack of capacitor structures through an opening in the mask material;
   partially removing a dielectric material between a first electrode and a second electrode of each of the vertically uppermost levels of the vertical stack of capacitor structures;
   forming a conductive material within the opening and between the first electrode and the second electrode of each of the vertically uppermost levels of the vertical stack of capacitor structures; and
   recessing a portion of the conductive material to form isolated conductive structures from a vertically uppermost level of the vertical stack of capacitor structures and an additional conductive structure electrically connecting horizontally neighboring capacitor structures vertically underlying the vertically uppermost level of the vertical stack of capacitor structures.

13. The method of claim 12, wherein forming a conductive material within the opening comprises forming a conductive material having a different material composition than the first electrode and the second electrode of each of the vertically uppermost levels of the vertical stack of capacitor structures.

14. The method of claim 12, wherein removing a portion of the conductive material comprises forming two of the isolated conductive structures for every additional conductive structure.

15. The method of claim 12, wherein forming a vertical stack of memory cells comprises forming a conductive pillar structure in electrical communication with the vertical stack of access devices.

16. The method of claim 15, wherein forming the additional conductive structure comprises forming the additional conductive structure to be in electrical communication with a horizontally neighboring transistor of the vertical stack of access devices.

17. The method of claim 16, wherein forming a conductive pillar structure in electrical communication with the vertical stack of access devices comprises forming the conductive pillar structure in electrical communication with the horizontally neighboring transistor of the vertical stack of access devices.

18. The method of claim 15, wherein forming isolated conductive structures comprises forming each of the isolated conductive structures to be in electrical communication with a horizontally neighboring multiplexer of the vertical stack of access devices.

19. The method of claim 18, wherein forming a conductive pillar structure in electrical communication with the vertical stack of access devices comprises forming the conductive pillar structure configured to be in electrical communication with the horizontally neighboring multiplexer of the vertical stack of access devices.

20. The method of claim 12, further comprising forming global digit line contacts each individually in electrical communication with one of the isolated conductive structures.

21. The method of claim 20, further comprising forming global digit lines vertically overlying the vertical stack of memory cells, each of the global digit lines in electrical communication with multiple of the global digit line contacts.

22. A method of forming a microelectronic device, the method comprising:
  forming vertical stacks of memory cells, each individually comprising:
    vertically spaced levels of capacitor structures;
    vertically spaced levels of access devices horizontally neighboring the vertically spaced levels of capacitor structures;
    a conductive pillar structure vertically extending through the vertically spaced levels of access devices; and
    a conductive plate structure in electrical communication with an electrode of the vertically spaced levels of the capacitor structures;
  removing a portion of the conductive plate structure;
  removing dielectric material from vertically uppermost two levels of the vertically spaced levels of capacitor structures;
  forming conductive material in contact with the conductive plate structure and the vertically uppermost two levels of the vertically spaced levels of capacitor structures; and
  removing a portion of the conductive material to form:
    isolated conductive structures from each capacitor structure within a vertically uppermost level of the capacitor structures; and
    an additional conductive structure from other of the capacitor structures vertically underlying the vertically uppermost level of the capacitor structures.

23. The method of claim 22, wherein forming isolated conductive structures comprises forming two of the isolated conductive structures within horizontal boundaries of the additional conductive structure.

24. The method of claim 22, wherein forming conductive material in contact with the conductive plate structure and the vertically uppermost two levels of the vertically spaced levels of capacitor structures comprises forming the conductive material to comprise a different material composition than the electrodes of each of the vertically uppermost two levels of the vertically spaced levels of capacitor structures.

25. The method of claim 22, wherein removing dielectric material from vertically uppermost two levels of the vertically spaced levels of capacitor structures comprises removing the dielectric material without substantially removing electrode materials of the vertically uppermost two levels of the vertically spaced levels of capacitor structures.

26. The method of claim 22, wherein forming an additional conductive structure comprises forming the additional conductive structure to be in electrical communication with the conductive plate structure.

27. The method of claim 26, further comprising forming the additional conductive structure to have a different material composition than the conductive plate structure.

28. An electronic system, comprising:
  an input device;
  an output device;
  a processor device operably coupled to the input device and the output device; and
  a memory device operably coupled to the processor device and comprising:
    a vertical stack of capacitor structures horizontally neighboring a vertical stack of access devices;
    a conductive pillar structure vertically extending through the vertical stack of access devices and configured to be in electrical communication with access devices of the vertical stack of access devices;
    a conductive plate structure in electrical communication with the vertical stack of capacitor structures;
    isolated conductive structures in electrical communication with vertically uppermost access devices of the vertical stack of access devices, the isolated conductive structures comprising substantially the same material composition as electrodes of the vertical stack of capacitor structures;
    a global digit line vertically overlying the isolated conductive structures; and
    conductive contact structures individually in electrical communication with the global digit line and one of the isolated conductive structures.

29. The electronic system of claim 28, further comprising an additional conductive structure vertically underling the isolated conductive structures and comprising substantially the same material composition as the electrodes of the vertical stack of capacitor structures.

30. The electronic system of claim 29, wherein the additional conductive structure is configured to be in electrical communication with the conductive pillar structure and an additional conductive pillar structure vertically extending through an additional vertical stack of access devices.

* * * * *